US012771372B2

(12) United States Patent
Jung et al.

(10) Patent No.: US 12,771,372 B2
(45) Date of Patent: Oct. 20, 2026

(54) ANALOG-TO-DIGITAL CONVERTER AND IMAGE SENSOR INCLUDING THE SAME

(71) Applicant: Samsung Electronics Co., Ltd., Suwon-si (KR)

(72) Inventors: Seunghoon Jung, Suwon-si (KR); Sungyong Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 78 days.

(21) Appl. No.: 19/024,232

(22) Filed: Jan. 16, 2025

(65) Prior Publication Data

US 2025/0266843 A1 Aug. 21, 2025

(30) Foreign Application Priority Data

Feb. 21, 2024 (KR) ........................ 10-2024-0025253

(51) Int. Cl.
*H03M 1/34* (2006.01)
*H04N 25/772* (2023.01)
*H04N 25/78* (2023.01)

(52) U.S. Cl.
CPC ............ *H03M 1/34* (2013.01); *H04N 25/772* (2023.01); *H04N 25/78* (2023.01)

(58) Field of Classification Search
None
See application file for complete search history.

(56) References Cited

U.S. PATENT DOCUMENTS

| | | | | |
|---|---|---|---|---|
| 8,477,220 | B2 * | 7/2013 | Yamazaki | H03M 1/14 348/241 |
| 2008/0278363 | A1 * | 11/2008 | Okumura | H04N 25/78 341/155 |
| 2010/0110252 | A1 | 5/2010 | Shimomura et al. | |
| 2012/0229319 | A1 * | 9/2012 | Takahashi | H03M 1/007 341/155 |
| 2015/0028190 | A1 | 1/2015 | Shin et al. | |
| 2015/0124137 | A1 | 5/2015 | Sato et al. | |
| 2015/0188559 | A1 * | 7/2015 | Kim | H03M 1/12 341/155 |
| 2015/0326811 | A1 | 11/2015 | Nishida et al. | |
| 2017/0133418 | A1 | 5/2017 | Hwang | |
| 2018/0041218 | A1 * | 2/2018 | Sato | H04N 25/618 |
| 2019/0067359 | A1 * | 2/2019 | Matsumoto | H10F 39/811 |
| 2020/0275045 | A1 | 8/2020 | Higashi et al. | |
| 2021/0135682 | A1 | 5/2021 | Nakano | |
| 2022/0269482 | A1 * | 8/2022 | Fan | G06F 7/575 |

FOREIGN PATENT DOCUMENTS

KR 10-2013-0032456 A 4/2013

* cited by examiner

*Primary Examiner* — Quan Pham
(74) *Attorney, Agent, or Firm* — Muir Patent Law, PLLC

(57) ABSTRACT

An image sensor includes a counter circuit that outputs a count value corresponding to a magnitude of a pixel signal. The counter circuit includes a first counter circuit that latches a counting code to generate at least one least significant bit signal of a count value; and a second counter circuit that generates most significant bit signals sequentially toggling in response to one of the at least one least significant bit signal or an inversion signal of the one of the at least one least significant bit signal. The first counter circuit includes a plurality of latch circuits and an addition circuit. The second counter circuit is arranged between the plurality of latch circuits along a first virtual line connecting a comparator and the plurality of latch circuits.

20 Claims, 14 Drawing Sheets

187

ANALOG-TO-DIGITAL CONVERTER AND IMAGE SENSOR INCLUDING THE SAME

CROSS-REFERENCE TO RELATED APPLICATION(S)

This application claims priority under 35 U.S.C. § 119 to Korean Patent Application No. 10-2024-0025253 filed on Feb. 21, 2024, in the Korean Intellectual Property Office, the disclosure of which is incorporated by reference herein in its entirety.

BACKGROUND

Embodiments of the present disclosure described herein relate to an analog-to-digital converter and a complementary metal oxide semiconductor (CMOS) image sensor, and more particularly, relate to an analog-to-digital converter that converts a pixel signal of an image sensor into a digital signal and an image sensor including the same.

An image sensor, which is a device that converts an optical signal into an electrical signal, includes a charge coupled device (CCD) image sensor and a complementary metal oxide semiconductor (CMOS) image sensor.

The analog-to-digital converter (ADC) of an image sensor converts an analog pixel signal into a counting value which is a digital signal. The ADC may be arranged for each column or pixel.

While power usage increases due to an increase in the number of pixels of an image sensor, the importance of low-power driving capability for a mobile environment has also increased. In other words, it is also important to reduce the power consumed by the ADC.

SUMMARY

Embodiments of the present disclosure provide an ADC and an image sensor that operate at low power.

Embodiments of the present disclosure provide an ADC and an image sensor with reduced power consumption and maximum current.

According to an embodiment, an image sensor includes a pixel array including a plurality of pixels, each pixel configured to output a pixel signal; a comparator that generates a comparison signal based on a ramp signal and the pixel signal; a counter circuit that receives a counting code and the comparison signal and outputs a count value corresponding to a magnitude of the pixel signal based on the comparison signal; and a control circuit that controls the plurality of pixels, the comparator, and the counter circuit, wherein the counter circuit includes a first counter circuit that latches the counting code to generate at least one least significant bit signal of the count value; and a second counter circuit that generates most significant bit signals sequentially toggling in response to one of the at least one least significant bit signal or an inversion signal of the one of the at least one least significant bit signal. The first counter circuit includes a plurality of latch circuits and an addition circuit. The second counter circuit is arranged between the plurality of latch circuits along a first virtual line connecting the comparator and the plurality of latch circuits. The image sensor may be formed on a substrate including a front surface and a back surface opposite to the front surface. The first virtual line may be parallel to the front surface or the back surface of the substrate.

According to an embodiment, an image sensor includes a pixel array including a plurality of pixels; a plurality of column lines that outputs pixel voltages of the plurality of pixels; a plurality of comparators connected to each of the plurality of column lines, and each configured to generate a comparison signal based on a ramp signal and a pixel voltage; and a plurality of counter circuits that receives the comparison signal from each of the plurality of comparators and outputs a count value corresponding to the pixel voltage based on the comparison signal, wherein each of the plurality of counter circuits includes a first latch circuit that latches a gray code, a second latch circuit that latches a first binary code among outputs of the first latch circuit; a most significant bit counter circuit that receives an output of a most significant bit among the outputs of the first latch circuit and counts high-order n bits of the count value, n is an integer of 1 or more; and an arithmetic unit that performs an operation on a second binary code among the outputs of the first latch circuit and the first binary code. The gray code corresponds to lower-order m bits of the count value, m is an integer of 1 or more. The most significant bit counter circuit is arranged such that a first distance between the first latch circuit and the most significant bit counter circuit is smaller than a second distance between the first latch circuit and the second latch circuit.

According to an embodiment, an image sensor includes a pixel array including a plurality of pixels, each pixel configured to output a pixel signal, and an analog-to-digital converter configured to convert the pixel signal into pixel data. The analog-to-digital converter includes a comparator that generates a comparison signal based on a ramp signal and an input signal; and a counter circuit that receives a counting code and the comparison signal and outputs a count value corresponding to a magnitude of the input signal based on the comparison signal. The counter circuit includes a first counter circuit including a plurality of latch circuits and an adder, and configured to latch the counting code, and generate least significant bit signals of the count value; and a second counter circuit that generates most significant bit signals sequentially toggling in response to one of the least significant bit signals or an inversion signal of the one of the least significant bit signals. The plurality of latch circuits, the adder, and the second counter circuit are arranged in series, and the second counter circuit is arranged between the plurality of latch circuits.

The ADC and image sensor according to the present disclosure may reduce power consumption and maximum current.

BRIEF DESCRIPTION OF THE FIGURES

The above and other objects and features of the present disclosure will become apparent by describing in detail embodiments thereof with reference to the accompanying drawings.

DETAILED DESCRIPTION

Hereinafter, embodiments of the present disclosure will be described clearly and in detail so that those skilled in the art can easily carry out embodiments of the present disclosure.

Figure 1:
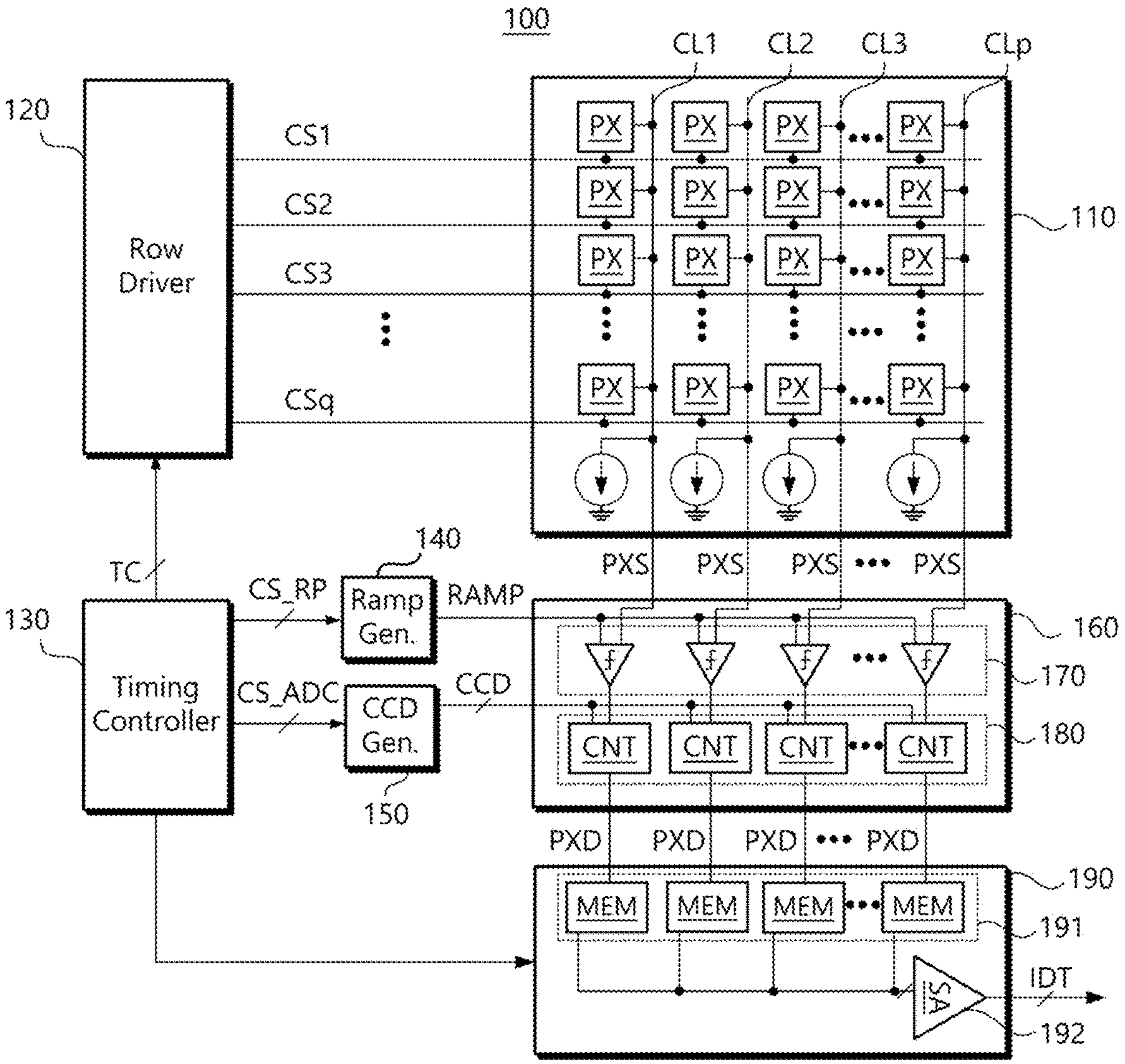
FIG. 1 is a block diagram illustrating an image sensor according to an embodiment of the present disclosure.

FIG. 1 is a block diagram illustrating an image sensor 100 according to an embodiment of the present disclosure.

The image sensor 100 may be used for an image device. The image device may be an electronic device such as a digital camera, a smartphone, a wearable device, Internet of Things (IoT), a tablet computer, a personal computer (PC), a personal digital assistant (PDA), a portable multimedia player (PMP), a navigation device, or the like. In addition, the image device may be an electronic device provided as accessory equipment included in a vehicle, a manufacturing facility, a door, various measuring devices, or the like.

The image sensor 100 may generate image data IDT, which is visual information of an object imaged through a lens, and provide the generated image data IDT to an image signal processor (ISP: not shown). The image signal processor may be implemented to process the image data IDT generated from the image sensor 100 and output the processed image data to a display device or store the processed image data in a storage device.

The image signal processor may demosaic an image signal according to a pixel pattern through interpolation, perform color correction, adjust a dynamic range, or reduce noise through filtering or the like. The image signal processor may additionally perform other schemes of improving image quality. Some logic of the image signal processor may be arranged in the image sensor 100, and other logic may be arranged in an application processor (AP) outside the image sensor 100.

The image sensor 100 may include a pixel array 110, a row driver 120, a timing controller 130, a ramp signal generator 140, a counting code generator 150, an ADC 160, and an output buffer 190.

For example, the image sensor 100 may be formed in and on a substrate. The substrate may include a front surface and a back surface opposite to the front surface.

The pixel array 110 includes a plurality of pixels PXs. For example, the plurality of pixels PXs may be arranged in the pixel array 110 in a matrix form along a plurality of columns and a plurality of rows. The plurality of columns and plurality of rows may be parallel to the front surface and/or back surface of the substrate. Each pixel PX may be electrically connected to one row line and one column line among the plurality of row lines and the plurality of column lines CLI to CLp, p may be a natural number equal to or greater than2.

In an embodiment, each pixel PX may include a plurality of transistors controlled by the row driver 120. Alternatively, in another embodiment, two or more pixels PXs adjacent to each other may form one pixel group, and two or more pixels PXs included in the pixel group may share at least some of a transmission transistor, a driving transistor, a selection transistor, and a reset transistor with each other.

Each of the plurality of pixels PXs may include a photoelectric conversion element that converts an incident optical signal into an electrical signal. Each pixel PX may include at least one photoelectric conversion element.

The photoelectric conversion element may be a photodiode (PD). The photoelectric conversion element may include at least one of a photodiode (PD), a photocapacitor, photogate, a pinned photodiode (PPD), a partially pinned photodiode, an organic photodiode diode (OPD), a quantum dot (QD), and any combination thereof. Embodiments of the present disclosure are described on the premise that the photoelectric conversion element is a photodiode (PD), but other photoelectric conversion elements described above may be used and are not limited to the photodiode (PD).

The pixel array 110 may receive a plurality of pixel driving signals CS1 to CSq, q may be a natural number equal to or greater than 2, such as a selection signal for controlling a selection transistor, a reset signal for controlling a reset transistor, a transmission transistor control signal for controlling a transmission transistor, and the like. Each of the plurality of pixels of the pixel array 110 operates under control of the received pixel driving signals CS1 to CSq.

The row driver 120 may drive the plurality of rows of the pixel array 110 under control of the timing controller 130. The row driver 120 may generate a selection signal for driving one of the plurality of rows. The row driver 120 may activate pixels corresponding to the selected row. Pixel signals PXS of pixels of the selected row may be transmitted to the ADC 160 through the plurality of column lines CL1 to CLp. The pixel signals PXS generated from each pixel of the row selected by the selection signal of the row driver 120 may be transmitted to the ADC 160 through the column line corresponding to each pixel.

The pixel signal PXS may include a reset voltage signal and a pixel voltage signal. The pixel voltage signal may be a voltage of a floating diffusion region corresponding to charges generated from at least one photodiode (PD) included in each of the plurality of pixels. The reset voltage signal may be a voltage of a floating diffusion region that does not reflect charges generated from the photodiode (PD).

The timing controller 130 may control the pixel array 110, the row driver 120, the ramp signal generator 140, the counting code generator 150, and the ADC 160. The timing controller 130 may provide a timing control signal TC to the row driver 120. The timing controller 130 may control the ramp signal generator 140 through a ramp control signal CS_RP and control the ADC 160 through an ADC control signal CS_ADC. The ramp control signal CS_RP may include a lamp enable signal, and the like.

The ramp signal generator 140 may generate a ramp signal RAMP in response to the ramp enable signal. The ramp signal generator 140 may generate the ramp signal RAMP having a preset slope. The ramp signal generator 140 may provide the generated ramp signal RAMP to the ADC 160.

The ADC 160 may include a comparator 170 and a counter circuit 180. The ADC 160 may convert each of the reset voltage signal and the pixel voltage signal of the pixel signal PXS into pixel data PXD, which is a digital signal, based on the ramp signal RAMP and output the converted pixel data PXD. For example, the ADC 160 may convert the reset voltage signal and the pixel voltage signal into digital signals based on the ramp signal RAMP in a correlated double sampling (CDS) scheme, respectively and output the difference between the reset voltage signal and the pixel voltage signal as the pixel data PXD, which is a digital signal. The pixel data may be a counting value corresponding to the magnitude of the pixel signal PXS.

The counter circuit 180 according to an embodiment of the present disclosure may include a plurality of counter circuits. One of the plurality of counter circuits may be arranged between circuits constituting another counter circuit. The plurality of counter circuits may include a first counter circuit and a second counter circuit.

The first counter circuit may generate the least significant bits (LSBs) among the bits constituting the counting value, and the second counter circuit may generate the most significant bits (MSBs) among the bits constituting the counting value. The least significant bits may be composed of least significant bit signals, which are bit signals generated by the first counter circuit.

The second counter circuit may include a ripple counter that generates most significant bit signals by sequentially toggling in response to one of the least significant bit signals generated from the first counter circuit. Accordingly, the most significant bit signal corresponding to the least significant bit among the most significant bit signals generated from the second counter circuit may use the most significant bit of the least significant bit signals received from the first counter circuit as a clock signal. In this case, in order to provide the most significant bit of the least significant bit signals from the first counter circuit to the second counter circuit, the supply current may increase for each period of the provided least significant bit signal.

In the counter circuit 180 according to an embodiment of the present disclosure, the second counter circuit may be arranged between circuits constituting the first counter circuit. Accordingly, the most significant bit signal of the least significant bit signals generated from the first counter circuit and provided to the second counter circuit may be provided to the second counter circuit through a short path. As a result, the maximum value of the supply current provided to the second counter circuit may be reduced. In addition, the power consumed in the counter circuit 180 may be reduced. In particular, when the number of bits generated from the first counter circuit is smaller than the number of bits generated from the second counter circuit, the logic of the signal provided to the second counter circuit may transition more frequently, thereby increasing the power consumed by the counter circuit. In this case, the counter circuit 180 according to an embodiment of the present disclosure may reduce the power consumption of the counter circuit 180 because the signal provided to the second counter circuit is transmitted through a short path.

According to an embodiment of the present disclosure, the output buffer 190 may include a memory 191 and a sense amplifier 192. The memory 191 may include a plurality of static random access memory (SRAM) cells. For example, the pixel data PXD from the counter circuit 180 of the ADC 160 may be stored in the SRAM cells of the memory 191. The sense amplifier 192 may amplify the pixel data PXD stored in the memory 191 and output the amplified pixel data PXD as the image data IDT.

Figure 2A:
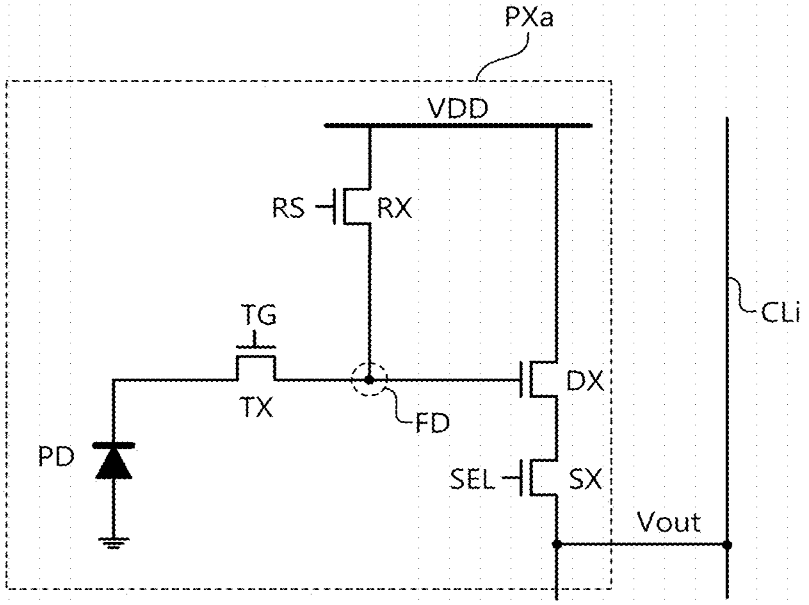
FIGS. 2A and 2B are diagrams illustrating pixels of an image sensor according to embodiments of the present disclosure.
Figure 2B:
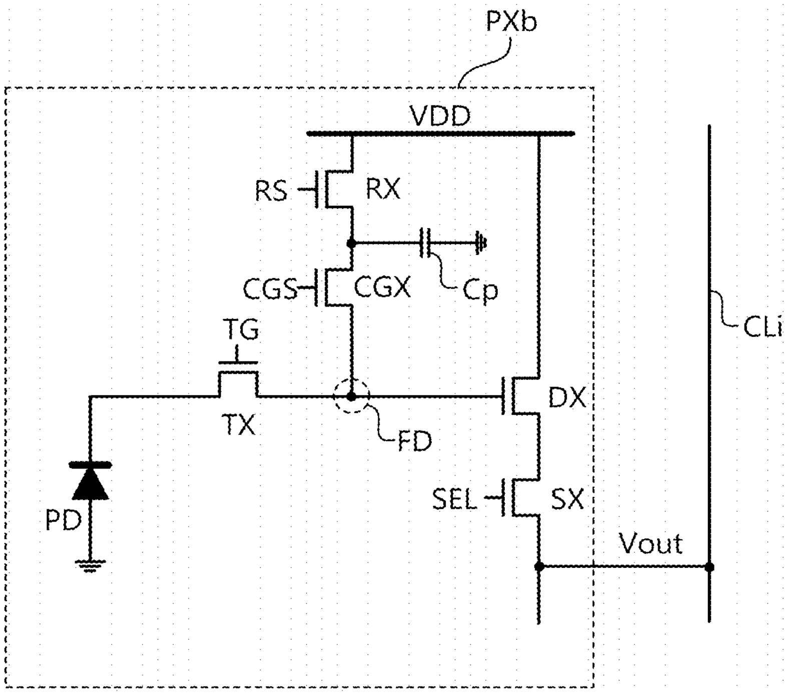

FIGS. 2A and 2B are diagrams illustrating pixels of an image sensor according to embodiments of the present disclosure. Each pixel PXa and PXb of FIGS. 2A and 2B may correspond to the pixel PX of the image sensor 100 of FIG. 1.

Referring to FIG. 2A, the pixel PXa may include a photoelectric conversion element PD, a transmission transistor TX, a floating diffusion node FD, a reset transistor RX, a driving transistor DX, and a selection transistor SX.

The photoelectric conversion element PD may generate photo charges corresponding to incident light.

The transmission transistor TX electrically connects the photoelectric conversion element PD to the floating diffusion node FD based on a transmission transistor control signal TG. When the transmission transistor TX is turned on, photo charges of the photoelectric conversion element PD electrically connected to the floating diffusion node FD may move to the floating diffusion node FD.

The reset transistor RX may electrically connect the floating diffusion node FD and a power supply voltage node VDD. The reset transistor RX may reset the floating diffusion node FD at the voltage level of the power supply voltage node VDD by a reset control signal RS provided from the row driver 120 of FIGS. 1 and 2. FIG. 2A illustrates that the reset voltage is provided from the power supply voltage node VDD, but according to an embodiment, the reset voltage may be provided from a voltage node having a voltage level other than the power supply voltage node VDD.

The driving transistor DX is driven with a driving voltage provided through the power supply voltage node VDD. The driving transistor DX may output an output voltage Vout corresponding to the charges accumulated in the floating diffusion node FD. The driving transistor DX may output the output voltage Vout to the column line CLi through the selection transistor SX.

The reset voltage signal output after connection of the floating diffusion node FD by the reset transistor RX and the pixel voltage signal output after the photo charges of the photoelectric conversion element PD moves to the floating diffusion node FD may be output to the column line CLi as the output voltage Vout, respectively.

The ADC 160 in FIG. 1 may generate a counting value corresponding to the magnitude of each of the reset voltage signal and the pixel voltage signal output to the column line CLi, and may output the difference as pixel data PXD. In this case, among the plurality of counter circuits of the ADC 160 of FIG. 1, the counter circuit that generates the least significant bits of the counting value may include at least two latch circuits including a latch circuit for storing the reset voltage signal and a latch circuit for storing the pixel voltage signal.

Referring to FIG. 2B, unlike the pixel PXa of FIG. 2A, the pixel PXb may further include a gain control transistor CGX and a capacitor Cp between the reset transistor RX and the floating diffusion node FD. The capacitor Cp may be a parasitic capacitor formed by the source terminal/drain terminal of the gain control transistor CGX. Alternatively, the capacitor Cp may be a passive element having a fixed or variable capacitance. The gain control transistor CGX may be turned on or off in response to a gain control signal CGS to selectively provide the capacitance of the capacitor Cp to the floating diffusion node FD, thereby providing a plurality of gain modes. In this case, according to an embodiment, among the plurality of counter circuits of the ADC 160 in FIG. 1, the counter circuit that generates the least significant bits of the counting value may include two latch circuits or three or more latch circuits.

Figure 3A:
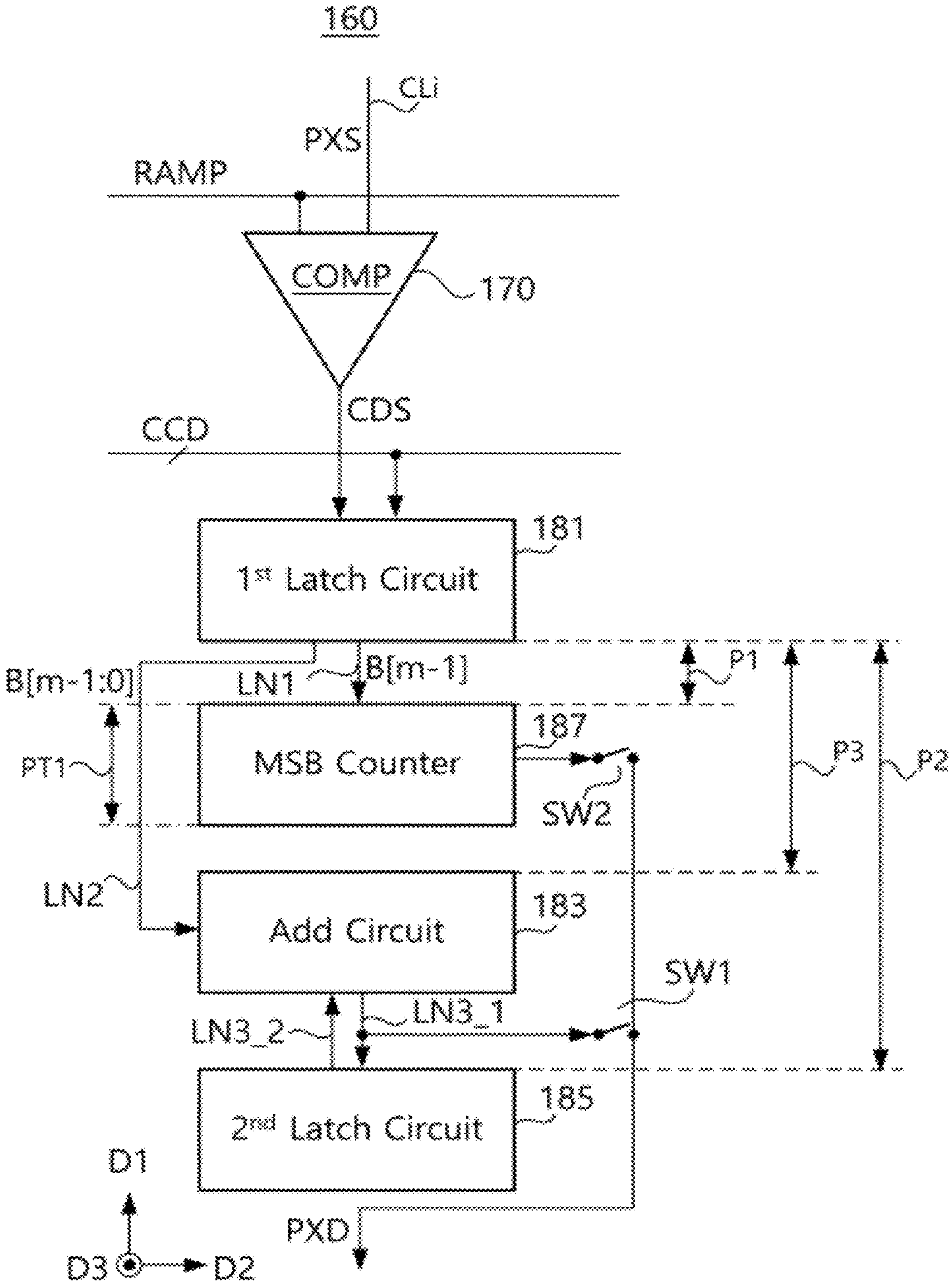
FIG. 3A is a diagram illustrating an ADC of an image sensor according to embodiments of the present disclosure.
Figure 3B:
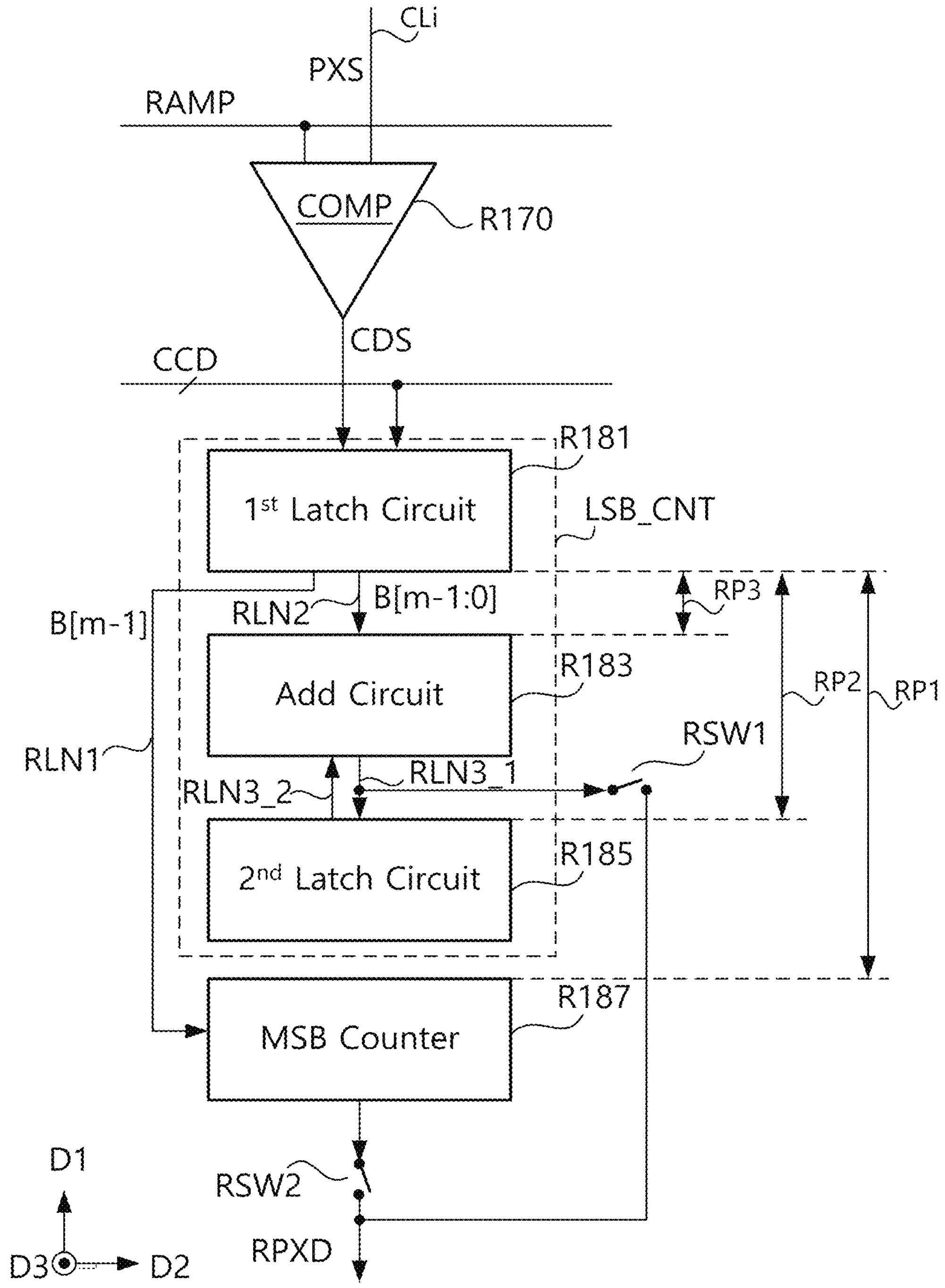
FIG. 3B illustrates a configurable ADC compared to the ADC of FIG. 3A according to an embodiment of the present disclosure.

FIGS. 3A and 3B are diagrams illustrating ADCs of an image sensor. The ADC in FIG. 3A illustrates the ADC of an image sensor according to an embodiment of the present disclosure. The ADC in FIG. 3A may correspond to the ADC 160 of the image sensor 100 in FIG. 1. FIG. 3B illustrates a configurable ADC compared to the ADC 160 of FIG. 3A according to an embodiment of the present disclosure. The ADC 160 according to an embodiment of the present disclosure will be described with reference to FIGS. 1, 3A and 3B.

The ADC 160 according to an embodiment of the present disclosure may be arranged in plurality to correspond to the plurality of columns of the image sensor 100, respectively.

The ADC 160 may include the comparator (COMP) 170, a plurality of latch circuits 181 and 185, an addition circuit 183, and a second counter circuit 187. The plurality of latch circuits may include the first latch circuit 181 and the second latch circuit 185.

The plurality of latch circuits 181 and 185 and the addition circuit 183 may constitute a first counter circuit. The first counter circuit 181, 183 and 185 may generate least significant bit signals corresponding to the least significant bits of the pixel data PXD, which is a counting value, and the second counter circuit 187 may generate a most significant bit signal corresponding to the most significant bit of the pixel data PXD. The second counter circuit 187 may be called a most significant bit (MSB) counter circuit.

The pixel signal PXS may be provided to the comparator 170 through one column line CLi of the plurality of column lines CL1 to CLp of the image sensor 100 in FIG. 1. The pixel signal PXS may be one of a reset voltage signal or a pixel voltage signal. The ramp signal RAMP generated from the ramp signal generator 140 may be provided to the comparator 170.

The comparator 170 may compare the ramp signal RAMP and the pixel signal PXS and provide a comparison signal CDS based on the comparison result of the two signals to the first latch circuit 181 of the first counter circuit. When the level of the ramp signal RAMP is equal to the level of the pixel signal PXS, the comparator 170 may output the comparison signal CDS that transitions from a first level (e.g., logic high) to a second level (e.g., logic low). The time point at which the level of the comparison signal CDS transitions may be determined according to the level of the pixel signal PXS.

The first latch circuit 181 may additionally receive a counting code generated by the counting code generator 150. In an embodiment, the counting code may be a gray code. For example, a gray code whose code value changes over time may be provided to the first latch circuit 181 as a counting code CCD. The counting code CCD may include m-bit data CCD[m−1:0], m is a positive integer of 2 or more.

The first latch circuit may include a plurality of latches. For example, the first latch circuit may include "m" latches corresponding to m-bit data CCD[m−1:0]. Each bit of the m-bit data CCD[m−1:0] of the counting code CCD may be simultaneously latched in "m" latches of the first latch circuit.

In an embodiment, after converting m-bit data CCD[m−1:0] of the latched counting code CCD into an m-bit binary code B[m−1:0], the first latch circuit 181 may output the converted binary code B[m−1:0]. The most significant bit B[m−1] of the binary code B[m−1:0] may be the same as the most significant bit signal among the least significant bit signals output from the first counter circuit 181, 183 and 185. The most significant bit B[m−1] of the binary code B[m−1:0] may be provided to the second counter circuit 187 through a first line LN1. The first line LN1 may be a line connecting the first latch circuit 181 and the second counter circuit 187. The binary code B[m−1:0] may be provided to the addition circuit 183 through a second line LN2. The addition circuit 183 may include a plurality of full-adders. The second line LN2 may be a line connecting the first latch circuit 181 and the addition circuit 183.

The second latch circuit 185 may store a first binary code that is a counting value of the pixel signal PXS corresponding to the reset voltage signal among the pixel signals PXS. The first binary code may be provided from the addition circuit 183 to the second latch circuit 185 through a third line LN3_1. Alternatively, according to an embodiment, the second latch circuit 185 may store the first binary code, which is a counting value of the pixel signal PXS corresponding to the pixel voltage signal among the pixel signals PXS. In an embodiment, the second latch circuit 185 may store the complement of the first binary code, which is a counting value of the pixel signal PXS corresponding to the reset voltage signal.

The addition circuit 183 may add the first binary code corresponding to the reset voltage signal stored in the second latch circuit 185 and the second binary code corresponding to the pixel voltage signal stored in the first latch circuit 181. The second latch circuit 185 may provide the first binary code to the addition circuit 183 through a third line LN3_2. The least significant bit signals resulting from the addition may be output as part of the pixel data PXD through a first switch SW1.

The second counter circuit 187 may generate most significant bit signals which sequentially toggle based on the most significant bit B[m−1] or the inverted value of the most significant bit B[m−1] received from the first latch circuit 181 through the first line LN1. In an embodiment, the second counter circuit 187 may include a plurality of flip-flops connected to each other in cascade, and the flip-flop located at the forefront among the plurality of flip-flops may receive the most significant bit B[m−1] or the inverted value of the most significant bit B[m−1] as a clock signal. After counting is completed, the second counter circuit 187 may output the toggled most significant bit signals through a second switch SW2 as part of the pixel data PXD.

Referring to FIG. 3A, the comparator 170, the first latch circuit 181, the second counter circuit 187, the addition circuit 183, and the second latch circuit 185 of the ADC 160 may be arranged in a row in the order mentioned. For example, the comparator 170 may be arranged closest to the pixel array 110, and the second latch circuit 185 may be arranged furthest from the pixel array 110. When providing a plurality of gain modes and including three or more latch circuits, the remaining latch circuits may be arranged in a row behind the second latch circuit 185. The comparator 170, the first latch circuit 181, the second counter circuit 187, the addition circuit 183, and the second latch circuit 185 of the ADC 160 may be arranged in a row in parallel with the column line CLi. When comparing a first distance P1 which is the distance between the first latch circuit 181 and the second counter circuit 187, a second distance P2 which is the distance between the first latch circuit 181 and the second latch circuit 185, and a third distance P3 which is the distance between the first latch circuit 181 and the addition circuit 183, the third distance P3 may be longer than the first distance P1, and the second distance P2 may be longer than the third distance P3.

In an embodiment, when assuming a first virtual line (not shown) connecting the comparator 170, the first latch circuit 181, the second counter circuit 187, the addition circuit 183, and the second latch circuit 185 of the ADC 160, the first virtual line may be parallel to the column line CLi. The first virtual line may be parallel to the front or back surface of the substrate. The substrate may include the front or back surface with an axis in a first direction D1 and a second direction D2, and the substrate may have a depth toward the inside of the substrate in a third direction D3 perpendicular to the first direction D1 and the second direction D2. For example, the front or back surface of the substrate may extend in the first direction D1 or the second direction D2.

Alternatively, when assuming the first virtual line (not shown) connecting the comparator 170, the first latch circuit 181, the addition circuit 183, and the second latch circuit 185 of the ADC 160, the second counter circuit 187 may be arranged between the first latch circuit 181 and the addition circuit 183 along the first virtual line.

At least a portion of the first line LN1, the second line LN2, and the third lines LN3_1 and LN3_2 may be formed inside the substrate. The lines in FIGS. 3A and 3B conceptually show the connection relationship between components, and the illustrations of the lines in FIGS. 3A and 3B may not necessarily be the same as the physical locations of the lines. For example, at least a portion of the second line LN2 in FIG. 3A may not be located at the same depth in the substrate as the second counter circuit 187. Accordingly, in an embodiment, because the second line LN2 connects the first latch circuit 181 and the addition circuit 183, and the first latch circuit 181, the second counter circuit 187 and the addition circuit 183 are arranged in line in the mentioned order, at least a portion PT1 of the second line LN2 may be located further inside (e.g., close to the back surface of the substrate) the substrate than the second counter circuit 187. For example, when assuming a second virtual line (not shown) perpendicular to the front or back surface of the substrate, the second virtual line may pass through at least the portion PT1 of the second line LN2 and the second counter circuit 187. Alternatively, when the substrate is viewed parallel to the second virtual line (when the substrate is viewed perpendicular to the front or back surface of the substrate), at least the portion PT1 of the second line LN2 and the second counter circuit 187 may be arranged to overlap.

Accordingly, the first line LN1 connecting the first latch circuit 181 and the second counter circuit 187 may be shorter than the second line LN2 connecting the first latch circuit 181 and the addition circuit 183. As a result, the most significant bit signal B[m−1] provided to the second counter circuit 187 among the binary code B[m−1:0] may pass through a very short path and be provided to the second counter circuit 187. For example, the parasitic capacitance of the first line LN1 may be reduced so that IR drop is reduced, thereby reducing the power consumed for transmission of the most significant bit signal B[m−1].

In contrast to the ADC 160 according to an embodiment of the present disclosure described with reference to FIG. 3A, the ADC arranged in each column in the image sensor may be exemplarily configured as the ADC in FIG. 3B.

The ADC of FIG. 3B may include a plurality of counter circuits. The plurality of counter circuits may include a first counter circuit LSB_CNT and a second counter circuit R187. The first counter circuit LSB_CNT of FIG. 3B may correspond to the first counter circuits 181, 183 and 185 of FIG. 3A, and the second counter circuit R187 of FIG. 3B may correspond to the second counter circuit 187 of FIG. 3A. A first latch circuit R181, an addition circuit R183, and a second latch circuit R185 in FIG. 3B may correspond to the first latch circuit 181, the addition circuit 183, and the second latch circuit 185 in FIG. 3A, respectively. A first line RLN1, a second line RLN2, and third lines RLN3_1 and RLN3_2 in FIG. 3B may correspond to the first line LN1, the second line LN2, and the third lines LN3_1 and LN3_2 in FIG. 3A.

Referring to FIG. 3B, the exemplary ADC may include the first latch circuit R181, the addition circuit R183, the second latch circuit R185, and the second counter circuit R187 that are arranged in order of proximity to a comparator R170 that receives the pixel signal PXS from the column line CLi. That is, according to the ADC of FIG. 3B, when comparing a first distance RP1 which is the distance between the first latch circuit R181 and the second counter circuit 187, a second distance RP2 which is the distance between the first latch circuit R181 and the second latch circuit R185, and a third distance RP3 which is the distance between the first latch circuit R181 and the addition circuit R183, the second distance RP2 may be longer than the third distance RP3, and the first distance RP1 may be longer than the second distance RP2. As a result, the most significant bit signal B[m−1] of the binary code B[m−1:0] may be provided to the second counter circuit R187 via a very long path. As a result, the parasitic capacitance of the first line RLN1 may increase so that IR drop increases, thereby increasing the power consumed for transmission of the most significant bit signal B[m−1].

Figure 4:
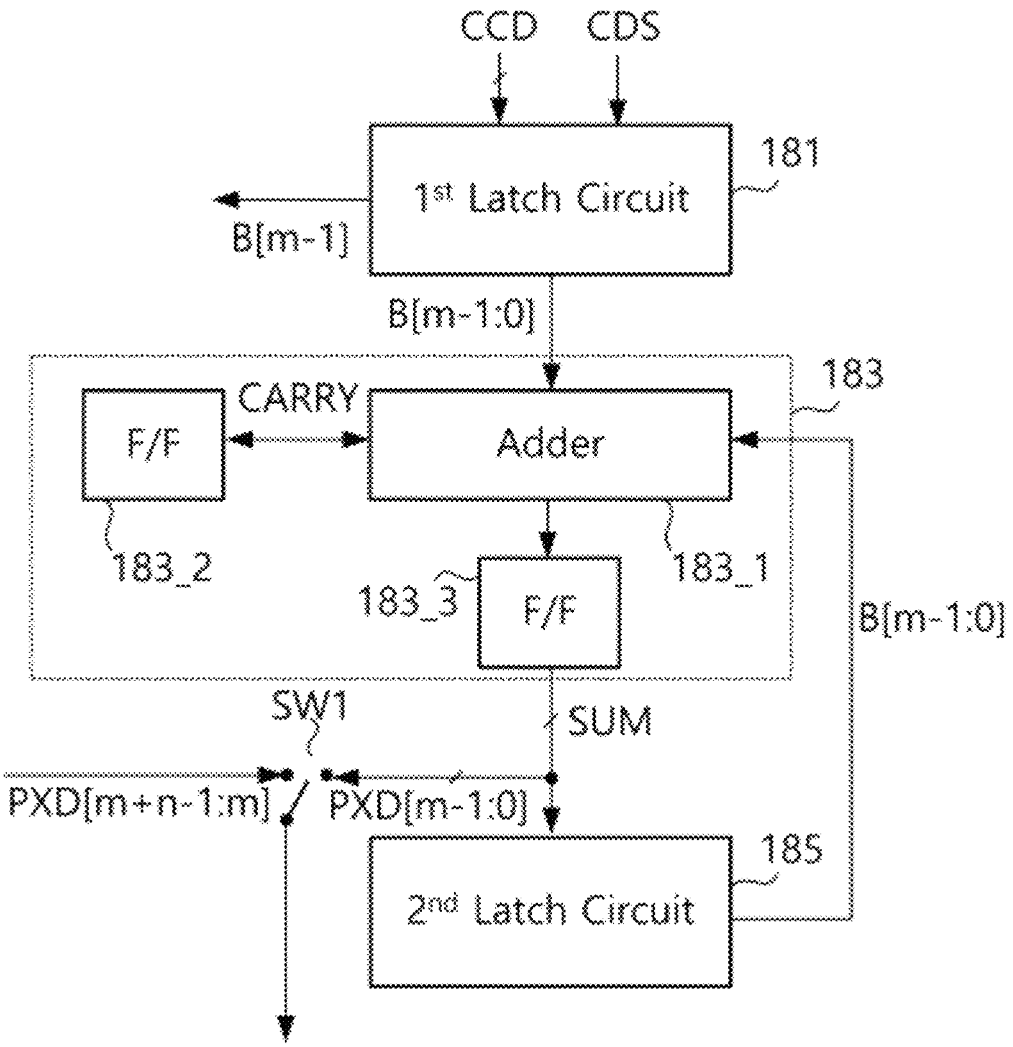
FIG. 4 is a block diagram illustrating a first counter circuit according to an embodiment of the present disclosure.

FIG. 4 is a block diagram illustrating a first counter circuit according to an embodiment of the present disclosure. The block diagram of FIG. 4 may include a first latch circuit 181, a second latch circuit 185, and an addition circuit 183. The first latch circuit 181, the second latch circuit 185, and the addition circuit 183 in FIG. 4 may correspond to the first latch circuit 181, the second latch circuit 185, and the addition circuit 183 in FIG. 3A, respectively.

The first latch circuit 181 may receive the comparison signal CDS and the counting code CCD. The counting code CCD may be a code whose value increases over time. In an embodiment, the counting code CCD may be a gray code. The counting code CCD may be m-bit. The comparison signal CDS may indicate the result of comparing the pixel signal PXS and the ramp signal RAMP by the comparator 170 in FIG. 3A. The first latch circuit 181 may latch the counting code CCD at a time point when the comparison signal CDS transitions to a low level. For example, the first latch circuit 181 may latch the counting code CCD based on the comparison signal CDS at a plurality of time points when the pixel signal PXS corresponds to the levels of each of the reset voltage signal and the pixel voltage signal.

The first latch circuit 181 may convert the latched m-bit counting code CCD into an m-bit binary code B[m−1:0]. The most significant bit signal B[m−1] of the converted binary code B[m−1:0] may be provided to the second counter circuit 187 in FIG. 3A. FIG. 4 is a block diagram conceptually explaining the operation of the first counter circuit 181, 183, and 185. The second counter circuit 187, not shown, may be arranged between the first latch circuit 181 and the addition circuit 183.

The first latch circuit 181 may provide the converted binary code B[m−1:0] as the first binary code to the addition circuit 183. For example, the first binary code may correspond to the level of the reset voltage signal.

In a state where the second latch circuit 185 is reset, the addition circuit 183 may complement the first binary code corresponding to the level of the received reset voltage signal and store the complement of the first binary code through a second flip-flop 183_3 in the second latch circuit 185.

In an embodiment, the addition circuit 183 may include an adder 183_1, a first flip-flop 183_2, and the second flip-flop 183_3.

The addition circuit 183 may receive a second binary code corresponding to the level of the pixel voltage signal from the first latch circuit 181. The addition circuit 183 may add the second binary code and the complement of the first binary code stored in the second latch circuit 185 and output an added result SUM through the second flip-flop 183_3. The added result SUM may be output through the first switch SW1. The added result SUM may constitute a least significant bit PXD[m−1:0] of the pixel data.

In an embodiment, the addition circuit 183 may be implemented including the 1-bit adder 183_1, where the adder 183_1 may receive and add the complement of the first binary code corresponding to the level of the negative reset voltage signal and the second binary code one bit at a time in order from the least significant bit. The carry generated by addition may be stored in the flip-flop 183_2 and provided to the adder 183_1 when adding the next bit. According to an embodiment, the addition circuit 183 may include a plurality of 1-bit adders.

Figure 5:
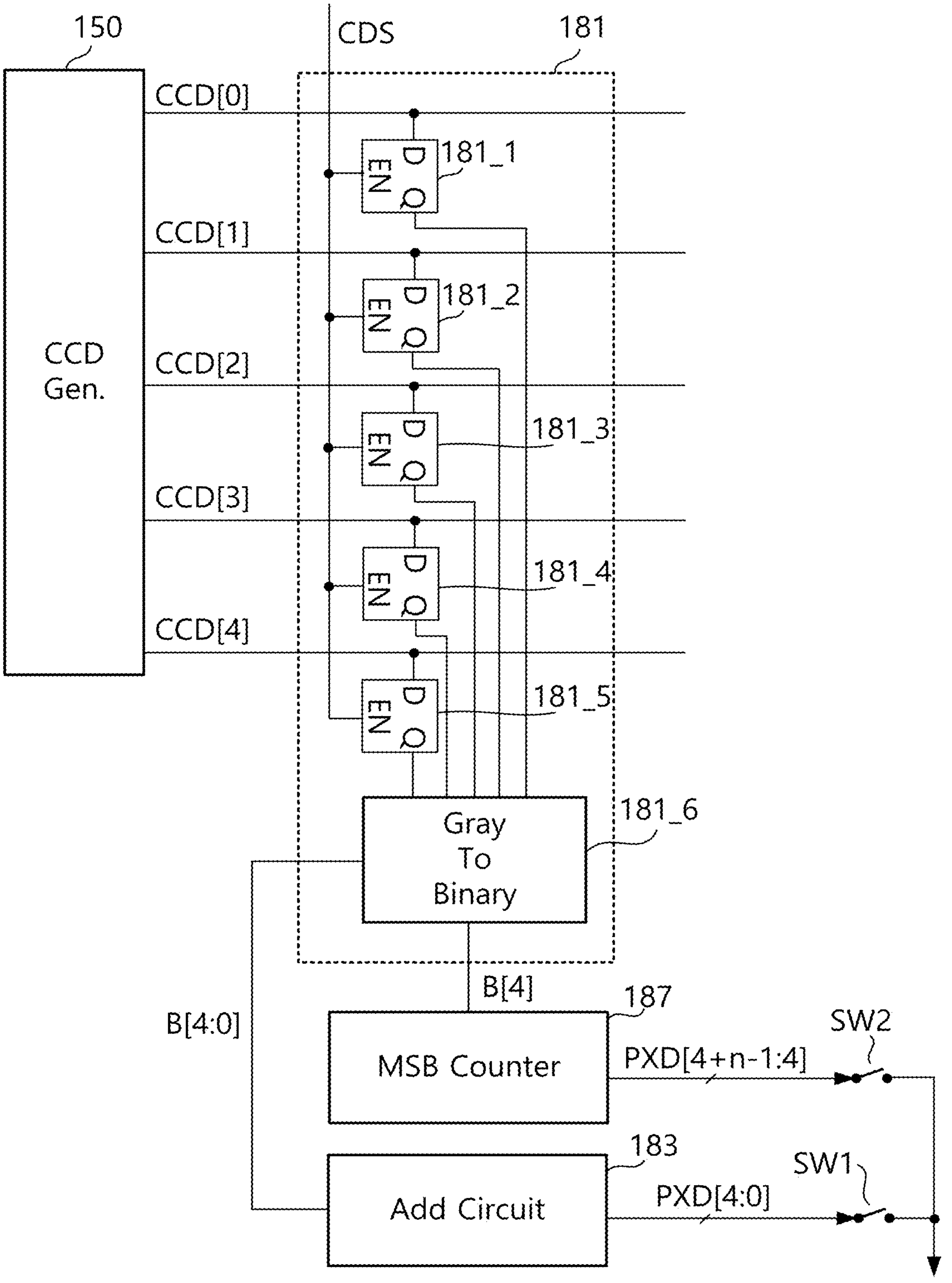
FIG. 5 is a circuit diagram illustrating an example of a first latch circuit according to an embodiment of the present disclosure.

FIG. 5 is a circuit diagram illustrating an example of a first latch circuit according to an embodiment of the present disclosure. The circuit diagram of FIG. 5 may include a first latch circuit 181, an addition circuit 183, and a second counter circuit 187. The first latch circuit 181, the addition circuit 183, and the second counter circuit 187 in FIG. 5 may correspond to the first latch circuit 181, the addition circuit 183, and the second counter circuit 187 in FIG. 3A, respectively.

The first latch circuit 181 may include a plurality of latches 181_1 to 181_5 and a gray code-binary code conversion circuit 181_6.

The first latch circuit 181 may receive the counting code CCD from the counting code generator 150. FIG. 5 illustrates, as an example, that the counting code CCD includes a 5-bit counting code CCD[0] to CCD[4] and the first latch circuit 181 includes five latches 181_1 to 181_5, but the number of bits of the counting code CCD and the number of latches included in the first latch circuit 181 may vary according to an embodiment.

Each of the plurality of latches 181_1 to 181_5 may receive a counting code (e.g., a gray code) generated from the counting code generator 150 one bit at a time through an input signal port "D". Each of the plurality of latches 181_1 to 181_5 may latch the gray code received based on the comparison signal CDS applied to an enable port EN, or transmit the gray code to the gray code-binary code conversion circuit 181_6 through an output port "Q".

The gray code-binary code conversion circuit 181_6 may convert the gray code received from the plurality of latches 181_1 to 181_5 into a binary code B[4:0], provide the most significant bit signal B[4] to the second counter circuit 187, and provide the converted binary code B[4:0] to the addition circuit 183.

The second counter circuit 187 may sequentially toggle based on the bit signal B[4] to output n-bit most significant bit signals PXD[4+n−1:4] of the pixel data through the second switch SW2. The addition circuit 183 may output 5-bit least significant bit signals PXD[4:0] of the pixel data through the first switch SW1.

FIG. 5 illustrates that each of the plurality of latches 181_1 to 181_5 receives a counting code (e.g., a gray code) in parallel one bit at a time, but in another embodiment, each of the plurality of latches 181_1 to 181_5 may be connected in cascade to serially receive a counting code (e.g., a gray code) one bit at a time. In this case, each of the plurality of latches 181_1 to 181_5 may receive the output of the previous latch as an input.

Figure 6:
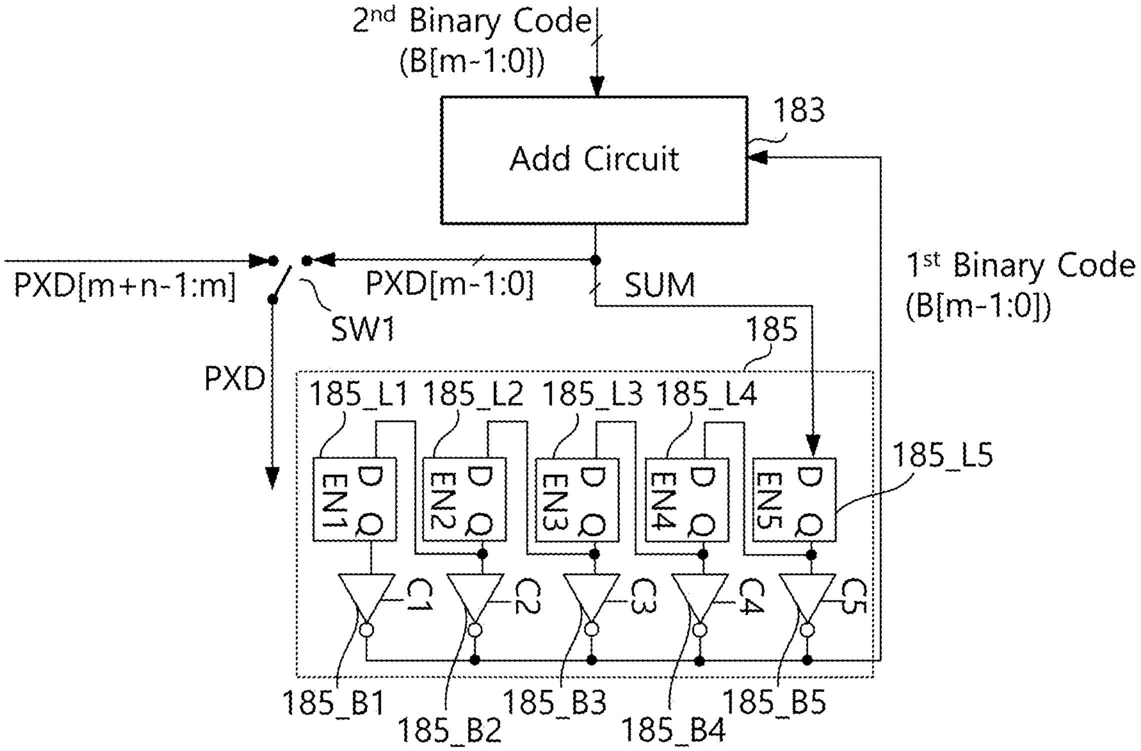
FIG. 6 is a circuit diagram illustrating an example of a second latch circuit according to an embodiment of the present disclosure.

FIG. 6 is a circuit diagram illustrating an example of a second latch circuit according to an embodiment of the present disclosure. The circuit diagram of FIG. 6 may include an addition circuit 183 and a second latch circuit 185. Each of the addition circuit 183 and the second latch circuit 185 in FIG. 6 may correspond to the addition circuit 183 and the second latch circuit 185 in FIG. 3A.

The second latch circuit 185 may include a plurality of latches 185_L1 to 185_L5 and a plurality of buffers 185_B1 to 185_B5. The plurality of latches 185_L1 to 185_L5 may receive and latch the first binary code B[m−1:0] corresponding to the level of the reset voltage signal provided from the first latch circuit 181 through the addition circuit 183.

In an embodiment, the plurality of latches 185_L1 to 185_L5 may be connected to each other in cascade. Among the two interconnected latches, the output port "Q" of the front latch may be connected to the input signal port "D" of the rear latch through a signal line. Accordingly, the value transmitted to each of the plurality of latches 185_L1 to 185_L5 may be bypassed sequentially through the plurality of latches 185_L1 to 185_L5 connected in series to each other by control of enable signals EN1 to EN5 input to each of the plurality of latches 185_L1 to 185_L5. As a result, the least significant bit B[0] of the first binary code B[m−1:0] may be stored in the latch 185_L1 among the plurality of latches 185_L1 to 185_L5, and the most significant bit signal B[m−1] may be stored in the latch 185_L5 among the plurality of latches 185_L1 to 185_L5.

Referring to FIG. 6, the plurality of latches 185_L1 to 185_L5 are connected to each other in cascade, but according to an embodiment, the plurality of latches may be arranged in parallel.

Each of the plurality of buffers 185_B1 to 185_B5 may receive and store values transmitted from each of the plurality of latches 185_L1 to 185_L5. Each of the plurality of buffers 185_B1 to 185_B5 may include a 3-phase inverter. Each 3-phase inverter may store values received from each of the plurality of buffers 185_B1 to 185_B5 or output the stored values based on a control signals C1 to C5 provided from an outside. The control signals Cl to C5 may be provided from the timing controller 130 in FIG. 1.

The first binary code B[m−1:0] corresponding to the level of the reset signal stored in each of the plurality of buffers 185_B1 to 185_B5 may be provided to the addition circuit 183 based on the control signals C1 to C5.

Figure 7:
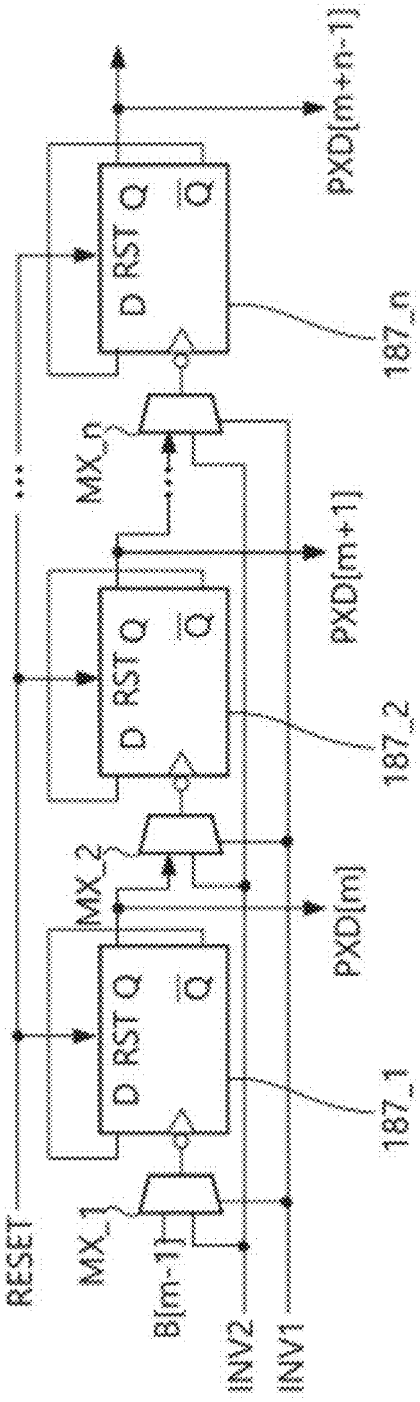
FIG. 7 is a circuit diagram illustrating an example of a second counter circuit according to an embodiment of the present disclosure.

FIG. 7 is a circuit diagram illustrating an example of a second counter circuit according to an embodiment of the present disclosure. A second counter circuit 187 of FIG. 7 may correspond to the second counter circuit 187 of FIG. 3A.

The second counter circuit 187 according to an embodiment of the present disclosure may include a plurality of flip-flops 187_1 to 187_n. The second counter circuit 187 may include an asynchronous ripple counter in which one flip-flop is triggered by an input clock signal. In an embodiment, each of the plurality of flip-flops 187_1 to 187_n may be implemented with a D-flip-flop that is triggered on the falling edge of a clock signal.

The first flip-flop 187_1 may receive the most significant bit signal B[m−1] provided from the first latch circuit 181 as a clock signal, and the remaining flip-flops 187_2 to 187_n may be connected to the output port "Q" of the front flip-flop. Toggling of the output ports "Q" and "/Q" of each of the plurality of flip-flops 187_1 to 187_n occurs at the falling edge of the input clock signal. The inverting output port "/Q" is connected to the data input port "D" of each of the plurality of flip-flops 187_1 to 187_n. Therefore, the plurality of flip-flops 187_1 to 187_n are synchronized with the falling edge of the clock signal to output bits PXD[m], PXD[m+1], . . . , and PXD[m+n−1] that repeat toggling. Accordingly, the plurality of flip-flops 187_1 to 187_n may generate n-bit signals PXD[m], PXD[m+1], . . . , and PXD[m+n−1], n is an integer greater than 1, which are toggled sequentially in response to the most significant bit signal B[m−1] among the outputs (e.g., a binary code B[m−1:0]) of the first latch circuit 181 in FIG. 3A. For example, the second counter circuit 187 may count the most significant n bits of the plurality of pixel data PXD.

Basically, each of the plurality of flip-flops 187_1 to 187_n includes a D-flip-flop that is triggered at the falling edge of a signal provided to a clock input terminal CLK.

The second counter circuit 187 according to an embodiment of the present disclosure may include the plurality of flip-flops 187_1 to 187_n with an inverting function.

For example, each of the plurality of flip-flops 187_1 to 187_n may receive a clock signal from multiplexers MX_1 to MX_n. Each of the multiplexers MX_1 to MX_n may output one of the clock signal and an inversion instruction signal INV2 received under control of an inversion control signal INV1. Each of the multiplexers MX_1 to MX_n may select the inversion instruction signal INV2 as an output when the inversion control signal INV1 transitions to logic high. Each of the plurality of flip-flops 187_1 to 187_n may be triggered at the falling edge of the inversion instruction signal INV2 to invert the stored value. According to an embodiment, the inversion function of the second counter circuit 187 may be implemented in different manners.

In an embodiment, the second counter circuit 187 may be toggled by the most significant bit signal B[m−1] of the first binary code B[m−1:0], and may invert and store the values of the most significant bit signals PXD[m], PXD [m+1], . . . , and PXD[m+n−1] corresponding to the level of the reset voltage signal for which counting has been completed based on the inversion instruction signal INV2. The second counter circuit 187 may toggle sequentially again by the most significant bit signal B[m−1] of the second binary code B[m−1:0] from the most significant bit signals PXD [m], PXD[m+1], . . . , and PXD[m+n−1] corresponding to the level of the inverted and stored (i.e., negative converted to 1's complement) reset signal. As a result, a count-up corresponding to the level of the pixel voltage signal may be performed, and finally, the most significant bit signal of the pixel data corresponding to the difference between the pixel voltage signal and the reset voltage signal may be output. According to an embodiment, the second counter circuit 187 may be implemented as an up/down counter. In this case, the second counter circuit 187 may perform an up-count of the pixel voltage signal after the down-count of the reset voltage signal is completed.

Figure 8:
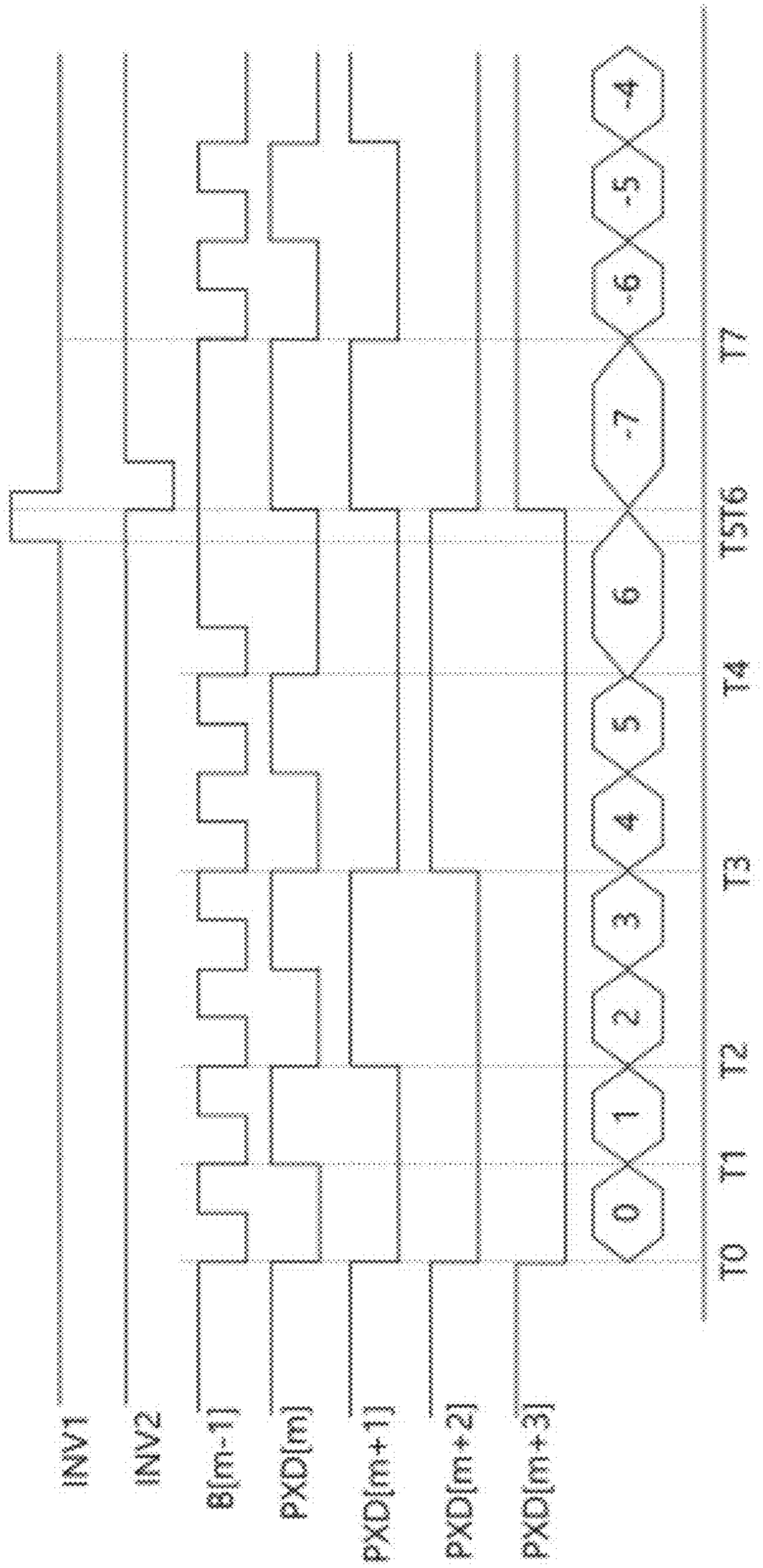
FIG. 8 is a timing diagram illustrating the operation of the second counter circuit of FIG. 7 for correlated double sampling (CDS) according to example embodiments.

FIG. 8 is a timing diagram illustrating the operation of the second counter circuit 187 of FIG. 7 for correlated double sampling (CDS) according to example embodiments. FIG. 8 will be illustrated assuming that the most significant bit signals PXD[m], PXD[m+1], . . . , and PXD[m+n−1] generated by the second counter circuit 187 are 4-bit signals.

Referring to FIG. 8, the second counter circuit 187 may invert the counting value corresponding to the level of the reset voltage signal to take the complement, and performs counting corresponding to the level of the pixel voltage signal, thereby performing correlated double sampling.

At time point T0, the most significant bit signal B[m−1] among the outputs of the first latch circuit 181 of FIG. 3A may be input.

At time point T1, as the level of the bit signal B[m−1] transitions to low, among the most significant bit signals PXD[m], PXD[m+1], PXD[m+2] and PXD[m+3], the 0-th bit signal PXD[m] may transition to level high.

At time point T2, as the bit signal B[m−1] transitions to level low, the 0-th bit signal PXD[m] may transition to level low, and accordingly, the first bit signal PXD[m+1] may transition to level low.

Similar to the time point T2, at time point T3, as the first bit signal PXD[m+1] transitions to level low, the second bit signal PXD[m+2] may transition to level high. In addition, at time point T4, as the second bit signal PXD[m+2] transitions to level low, the third bit signal PXD[m+3] may transition to level high.

Counting corresponding to the level of the reset voltage signal may end at the time point T4, and in this state, when the inversion control signal INV1 transitions to logic high at time point T5, the inversion instruction signal INV2 may transition to logic low at time point T6. Triggered by the inversion instruction signal INV2 transitioned to logic low, the most significant bit signals PXD[m], PXD[m+1], PXD [m+2], and PXD[m+3] are inverted and stored by the count value corresponding to the level of the reset voltage signal.

At time point T7, the most significant bit signal B[m−1] among the outputs of the first latch circuit 181 corresponding to the level of the pixel voltage signal may be received again, and correlated double sampling may be performed by performing counting based on the most significant bit signal B[m−1] corresponding to the level of the received pixel voltage signal.

Figure 9:
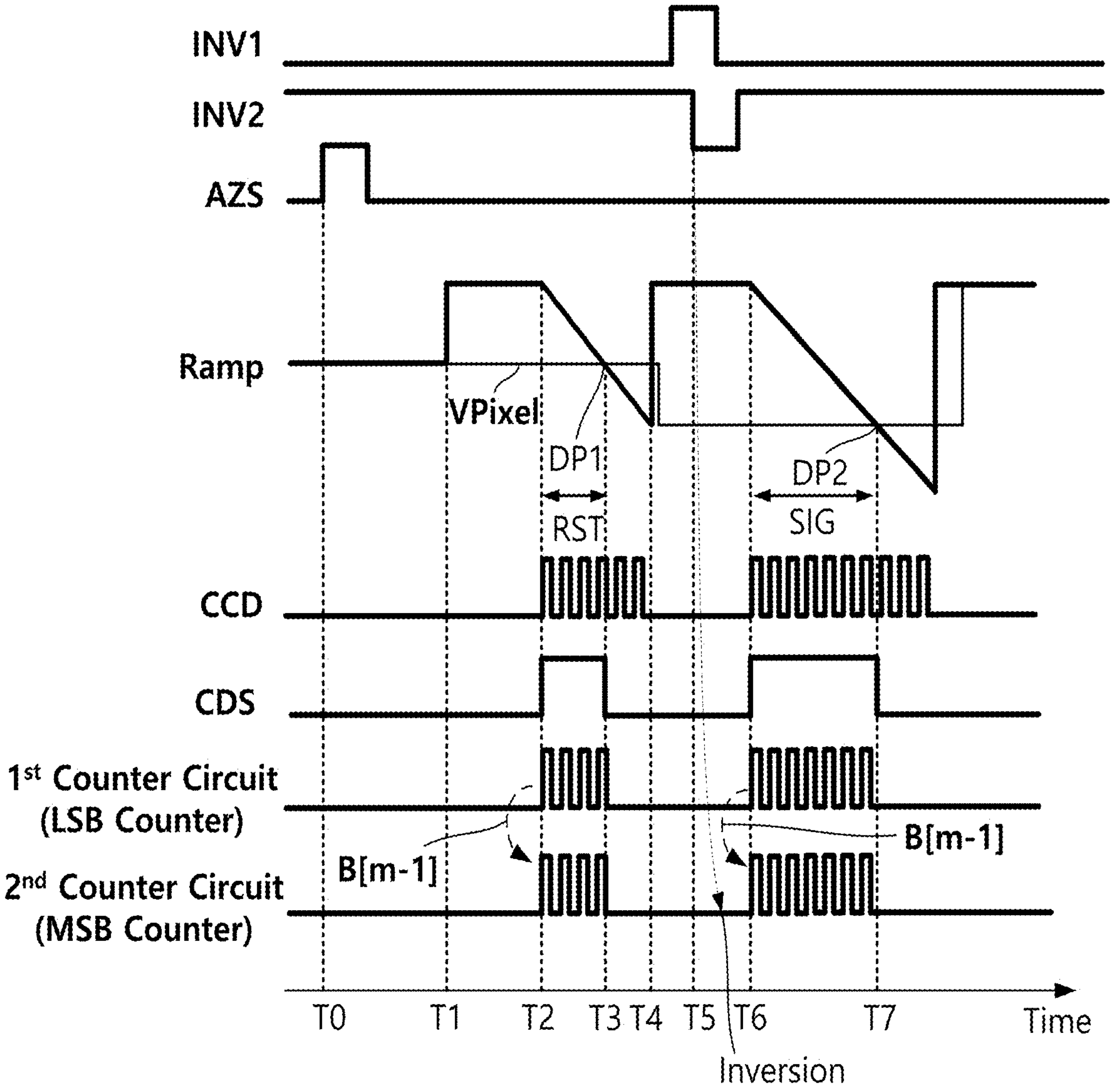
FIG. 9 is a timing diagram illustrating the operation of the ADC of FIG. 3A for correlated double sampling according to example embodiments.

FIG. 9 is a timing diagram illustrating the operation of the ADC 160 of FIG. 3A for correlated double sampling according to example embodiments. The operation of the ADC 160 will be described with reference to FIGS. 1, 3A, and 9.

After one row of the pixel array 110 of FIG. 1 is selected, the ADC 160 may be initialized in response to an auto-zero signal AZS at time point T0.

At time point T1, the ramp signal RAMP may rise to a specified level, and at time point T2, the ramp signal RAMP may fall at a specified level. The comparison signal CDS may transition to logic high and remain in a logic high state until time point T3, when it reaches a first decision point DP1 where a pixel signal VPixel corresponding to the reset voltage signal is equal to the ramp signal RAMP.

At the time point T2, the counting code CCD may be provided to the ADC 160, and the first counter circuit (least significant bit counter) may count the counting code CCD while the comparison signal CDS remains logic high. The second counter circuit (most significant bit counter) may sequentially perform toggling based on the most significant bit signal B[m−1] provided from the first counter circuit.

At time point T3, the comparison signal CDS may transition to logic low.

At time point T4, the ramp signal RAMP may rise again to a specified level and the first counter circuit and the second counter circuit may end counting and may temporarily store a counting value RST corresponding to the level of the reset voltage signal.

At time point T5, the inversion instruction signal INV2 may transition to logic low by the inversion control signal INV1 of logic high. The second counter circuit may invert the stored value and store it by the inversion instruction signal INV2.

At time point T6, the ramp signal RAMP may fall steadily again. The comparison signal CDS may transition back to logic high and remain in a logic high state until at time point T7 when the pixel signal VPixel corresponding to the pixel voltage signal reaches a second decision point DP2 where the pixel signal VPixel is equal to the ramp signal RAMP.

At the time point T7, the comparison signal CDS may transition to logic low, and the first counter circuit and the second counter circuit may reflect a counting value SIG corresponding to the level of the pixel voltage signal in the counting value RST corresponding to the level of the reset voltage signal, thereby outputting pixel data.

Figure 10:
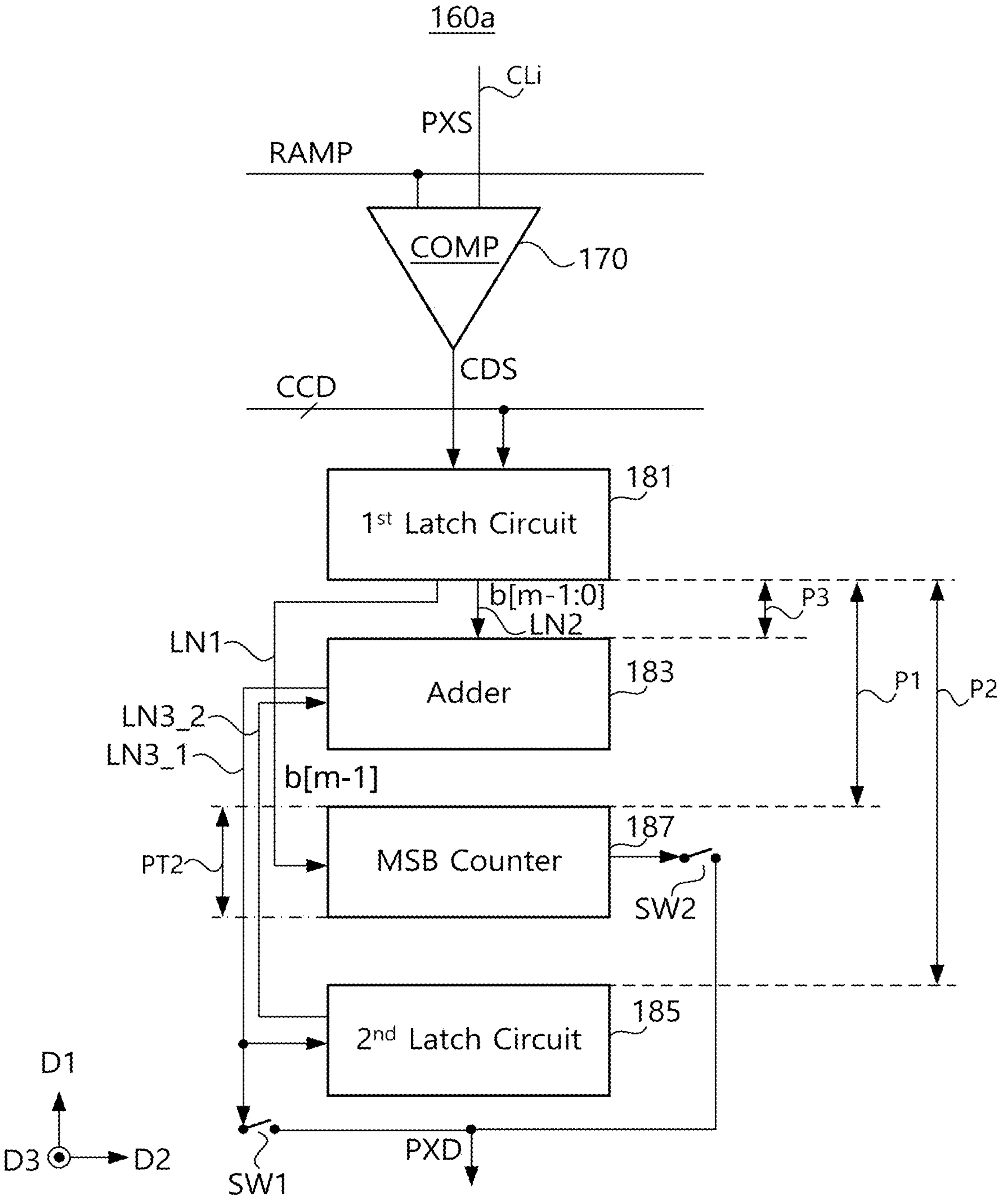
FIG. 10 is a diagram illustrating an ADC of an image sensor according to an embodiment.

FIG. 10 is a diagram illustrating an ADC 160*a* of an image sensor according to an embodiment. The ADC 160*a* of FIG. 10 may correspond to the ADC 160 of the image sensor 100 of FIG. 1. The ADC 160*a* according to an embodiment of the present disclosure will be described with reference to FIGS. 1, 3A, and 10. Detailed descriptions of parts that overlap or are similar to the ADC 160 previously described with reference to FIG. 3A will be omitted and the differences will be mainly described.

Referring to FIG. 10, unlike the ADC 160 of FIG. 3A, the ADC 160*a* may include the comparator 170, the first latch circuit 181, the addition circuit 183, the second counter circuit 187, and the second latch circuit 185 which are arranged in line in order. That is, the comparator 170 may arranged closest to the pixel array 110 and the second latch circuit 185 may be arranged furthest from the pixel array 110, which is the same as the ADC 160 in FIG. 3A, but the addition circuit 183 may be arranged adjacent to the first latch circuit 181.

The first latch circuit 181, the addition circuit 183, the second counter circuit 187, and the second latch circuit 185 may be arranged in line in the order mentioned along the direction parallel to the column line CLi. When comparing a first distance P1 which is the distance between the first latch circuit 181 and the second counter circuit 187, a second distance P2 which is the distance between the first latch circuit 181 and the second latch circuit 185, and a third distance P3 which is the distance between the first latch circuit 181 and the addition circuit 183, the first distance P1 may be longer than the third distance P3, and the second distance P2 may be longer than the first distance P1. That is, compared to the ADC 160 of FIG. 3A, the first distance P1, which is the distance between the first latch circuit 181 and the second counter circuit 187, may be longer than that of the ADC 160 of FIG. 3A, and the third distance P3, which is the distance between the first latch circuit 181 and the addition circuit 183, may decrease. Nevertheless, power consumption may be reduced because the first distance P1 is shorter than the first distance RP1 which is the distance between the first latch circuit R181 and the second counter circuit R187 in FIG. 3B.

In an embodiment, when assuming a first virtual line (not shown) connecting the comparator 170, the first latch circuit 181, the addition circuit 183, the second counter circuit 187, and the second latch circuit 185 arranged in series in the ADC 160*a*, the first virtual line may be parallel to the column line CLi and the first direction D1. The first virtual line may be parallel to the front or back surface of the substrate.

Alternatively, when assuming a second virtual line (not shown) connecting the comparator 170, the first latch circuit 181, the addition circuit 183, and the second latch circuit 185 of the ADC 160*a*, the second counter circuit 187 may be arranged along the second virtual line and between the addition circuit 183 and the second latch circuit 185.

At least a portion of the first line LN1, the second line LN2, and the third lines LN3_1 and LN3_2 may be formed inside the substrate, and at least a portion PT2 of the third lines LN3_1 and LN3_2 connecting the addition circuit 183 and the second latch circuit 185 may be located further inside the substrate than the second counter circuit 187. That is, when assuming a third virtual line (not shown) perpendicular to the front or back surface of the substrate, the third virtual line may pass through at least the portion PT2 of the third lines LN3_1 and LN3_2 and the second counter circuit 187. Alternatively, when the substrate is viewed parallel to the third virtual line (when the substrate is viewed perpendicular to the front or back surface of the substrate), at least the portion PT2 of the third lines LN3_1 and LN3_2 and the second counter circuit 187 may be arranged to overlap.

Figure 11:
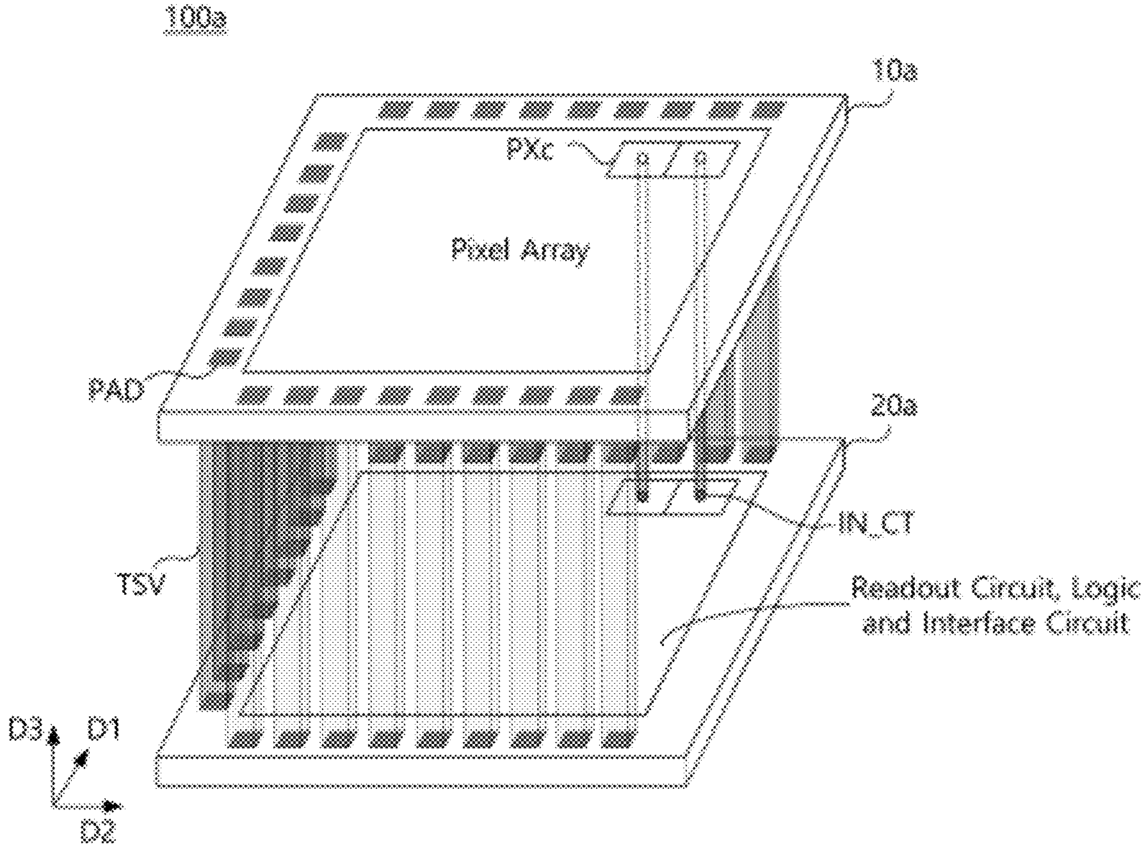
FIG. 11 is a block diagram of an image sensor according to an embodiment of the present disclosure.

FIG. 11 is a block diagram of an image sensor 100*a* according to an embodiment of the present disclosure. Detailed descriptions of parts that overlap with those described previously will be omitted.

The image sensor 100*a* may include a first chip 10*a* and a second chip 20*a* stacked.

For example, the first chip 10*a* may be stacked on the second chip 20*a* in a direction D3 perpendicular to the plane of a substrate. The first chip 10*a* and the second chip 20*a* may be electrically connected to each other. For example, the first chip 10*a* and the second chip 20*a* may transmit a pixel signal or a control signal through a through silicon via TSV between pads located in a peripheral area of the chip. The first chip 10*a* and the second chip 20*a* may also be electrically connected through an in-pixel contact IN_CT inside a pixel PXc. For example, the in-pixel contact may be a Cu-to-Cu (C2C) bonding contact. The pixel signal (or pixel data) of the first chip 10*a* may be transmitted to the read circuit (or image signal processing logic) of the second chip 20*a*.

There may be a plurality of pixels PXc in the pixel array, which is arranged in the pixel array in a matrix form.

The second chip 20*a* may include logic such as a read circuit, a timing controller, and image signal processing logic, and the like, and an interface circuit. The read circuit may include an ADC according to an embodiment of the present disclosure.

The second chip 20*a* according to an embodiment of the present disclosure may include one of the ADCs 160 and 160*a* described above. Alternatively, some circuits of the ADCs 160 and 160*a* may be arranged on the first chip 10*a*, and other circuits of the ADCs 160 and 160*a* may be arranged on the second chip 20*a*.

Figure 12:
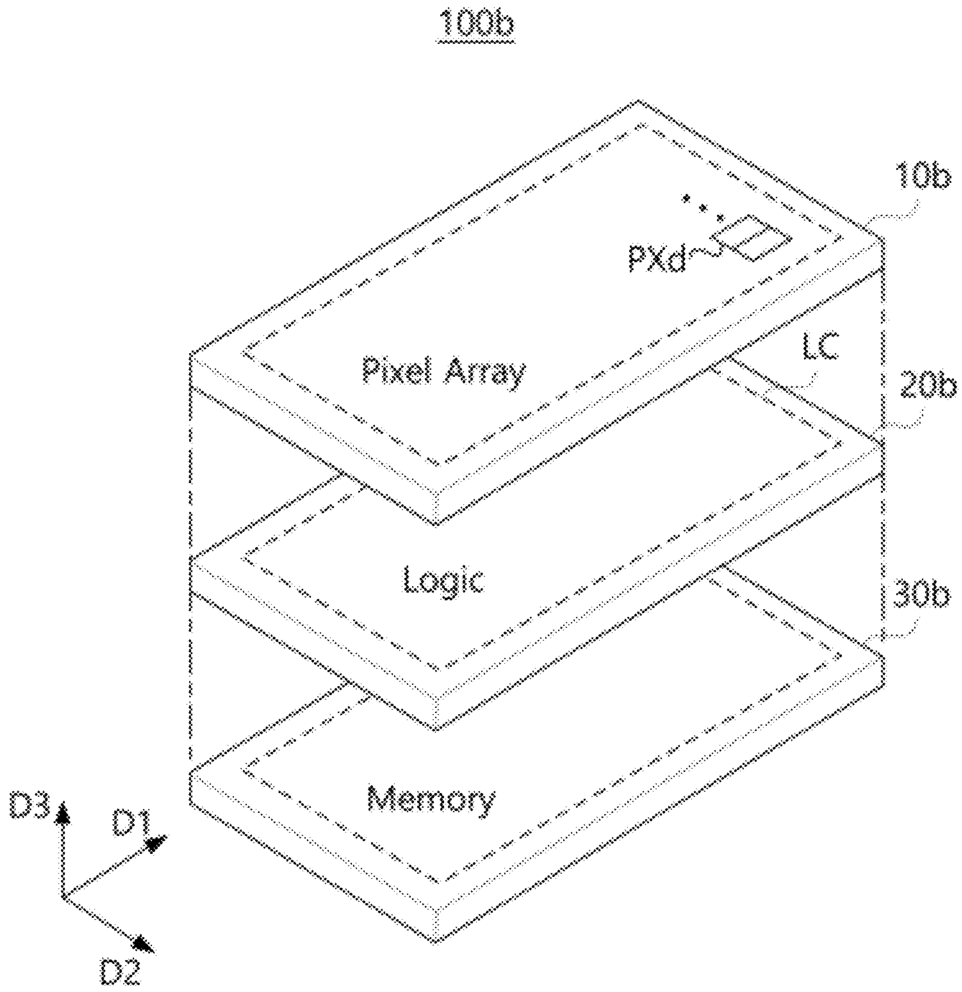
FIG. 12 is a block diagram of an image sensor according to an embodiment of the present disclosure.

FIG. 12 is a block diagram of an image sensor 100*b* according to an embodiment of the present disclosure. Detailed descriptions of parts that overlap with those described previously will be omitted.

Referring to FIG. 12, the image sensor 100*b* may further include a third chip 30*b* in addition to a first chip 10*b* and a second chip 20*b*. The third chip 30*b*, the second chip 20*b*, and the first chip 10*b* may be sequentially stacked in the direction D3 perpendicular to the plane of the substrate. The third chip 30*b* may include a memory device. For example, the third chip 30*b* may include a volatile memory device such as dynamic random access memory (DRAM), synchronous random access memory (SRAM) or the like. The third chip 30*b* may receive signals from the first chip 10*b* and the second chip 20*b* and process the signals through a memory device.

The second chip 20*b* according to an embodiment of the present disclosure may include one of the ADCs 160 and 160*a* described above. Alternatively, some circuits of the ADCs 160 and 160*a* may be arranged on the first chip 10*b*, and other circuits of the ADCs 160 and 160*a* may be arranged on the second chip 20*b*.

Figure 13:
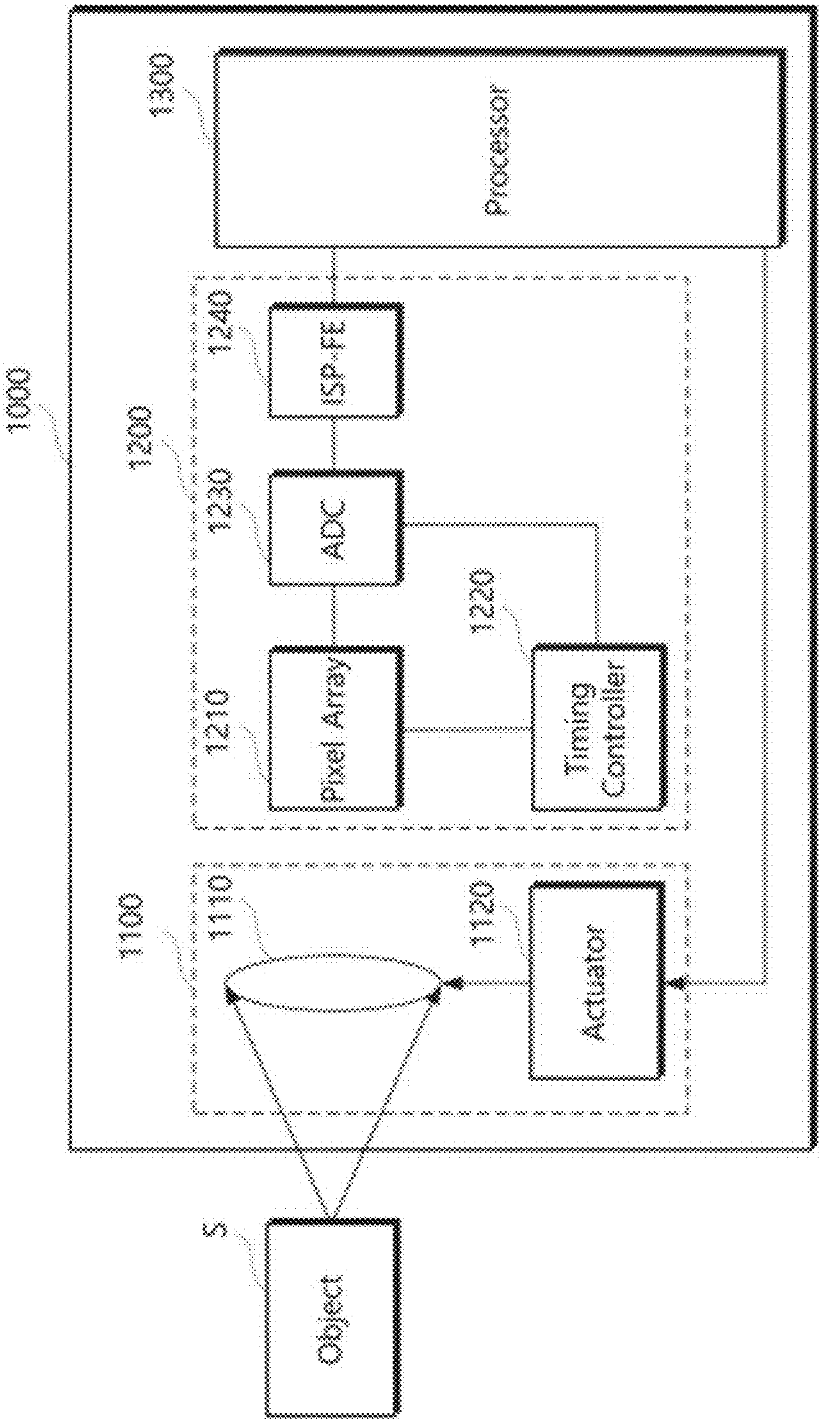
FIG. 13 is a block diagram of an electronic device according to an embodiment of the present disclosure.

FIG. 13 is a block diagram of an electronic device according to an embodiment of the present disclosure. Detailed descriptions of parts that overlap with those described previously will be omitted.

An electronic device 1000 may include an imaging unit 1100, an image sensor 1200, and a processor 1300. The electronic device 1000 may perform autofocusing based on phase data provided from the image sensor 1200 to the processor 1300.

The processor 1300 may control overall operations of the electronic device 1000. The processor 1300 may control the position of a lens 1110 by providing a control signal to a lens actuator 1120. As a result, the focal distance may be controlled.

The imaging unit 1100, which is a component that receives light, may include the lens 1110 and the lens actuator 1120. The lens 1110 may include a plurality of lenses.

The lens actuator 1120 may move the lens 1110 in a direction in which the distance from an object "S" increases or decreases based on a control signal from the processor 1300.

The image sensor 1200 may generate image data and phase data based on incident light. The image sensor 1200 may include a pixel array 1210, a timing controller 1220, an ADC 1230, and an image signal processor 1240.

Pixels of the pixel array 1210 may include at least one photoelectric conversion element.

The ADC 1230 according to an embodiment of the present disclosure may include one of the ADCs 160 and 160*a* described above. For example, a most significant bit counter constituting the ADC 1230 may be arranged between a plurality of latches constituting a least significant bit counter.

The processor 1300 may perform a disparity operation using phase data. The processor 1300 may provide a control signal based on the disparity operation result to the lens actuator 1120 to move the position of the lens 1110.

The processor 1300 may provide an operation mode control signal INFO_MD to the timing controller 1220. The timing controller 1220 may control the operation of the pixel array 1210 based on the operation mode control signal INFO_MD.

While the inventive concept has been particularly shown and described with reference to embodiments thereof, it will be understood that various changes in form and details may be made therein without departing from the spirit and scope of the present invention as set forth in the following claims.

What is claimed is:

1. An image sensor comprising:

a pixel array including a plurality of pixels, each pixel configured to output a pixel signal;

a comparator configured to generate a comparison signal based on a ramp signal and the pixel signal;

a counter circuit configured to receive a counting code and the comparison signal and output a count value corresponding to a magnitude of the pixel signal based on the comparison signal; and a control circuit configured to control the plurality of pixels, the comparator, and the counter circuit, wherein the counter circuit includes:

a first counter circuit configured to latch the counting code and generate at least one least significant bit signal of the count value; and a second counter circuit configured to generate most significant bit signals sequentially toggling in response to one of the at least one least significant bit signal or an inversion signal of the one of the at least one least significant bit signal, wherein the first counter circuit includes a plurality of latch circuits and an addition circuit, wherein the second counter circuit is arranged between the plurality of latch circuits along a first virtual line connecting the comparator and the plurality of latch circuits, wherein the image sensor is formed on a substrate including a front surface and a back surface opposite to the front surface, and wherein the first virtual line is parallel to the front surface or the back surface of the substrate.

2. The image sensor of claim 1, wherein the first counter circuit includes:

a first latch circuit configured to latch the counting code corresponding to the at least one least significant bit signal, convert the latched counting code into a binary code, and output the binary code;

a second latch circuit configured to latch a first binary code among outputs of the first latch circuit; and the addition circuit configured to add a second binary code among the outputs of the first latch circuit and the first binary code latched by the second latch circuit, and wherein the second counter circuit is arranged between the first latch circuit and the second latch circuit along the first virtual line.

3. The image sensor of claim 2, wherein:

the addition circuit is configured to receive the second binary code through a first line connected to the first latch circuit and receive the first binary code through a second line connected to the second latch circuit, the second counter circuit is configured to receive one of the at least one least significant bit signal from the first latch circuit through a third line, and a length of one of the first line and the second line is longer than a length of the third line.

4. The image sensor of claim 2, wherein:

the plurality of pixels are arranged in the pixel array along a plurality of columns and a plurality of rows parallel to the front surface or the back surface of the substrate, the addition circuit is configured to receive the second binary code through a first line connected to the first latch circuit and receive the first binary code through a second line connected to the second latch circuit, and a second virtual line perpendicular to the front surface or the back surface of the substrate passes through a portion of one of the first line or the second line and the second counter circuit.

5. The image sensor of claim 2, wherein:

the plurality of pixels are arranged in the pixel array along a plurality of columns and a plurality of rows parallel to the front surface or the back surface of the substrate, the addition circuit is configured to receive the second binary code through a first line connected to the first latch circuit and receive the first binary code through a second line connected to the second latch circuit, and at least a portion of the first line and the second line overlaps the second counter circuit when viewed from a direction perpendicular to the front surface or the back surface of the substrate.

6. The image sensor of claim 1, wherein the plurality of pixels are arranged in the pixel array along a plurality of columns and a plurality of rows, and wherein the first virtual line is parallel to one of the plurality of columns.

7. The image sensor of claim 6, wherein the first counter circuit includes:

a first latch circuit configured to latch the counting code corresponding to the at least one least significant bit signal, convert the latched counting code into a binary code, and output the binary code;

a second latch circuit configured to latch a first binary code among outputs of the first latch circuit; and the addition circuit configured to add a second binary code among the outputs of the first latch circuit and the first binary code latched by the second latch circuit, and wherein the first latch circuit, the second counter circuit, the addition circuit, and the second latch circuit are arranged close to the comparator along the first virtual line in an order of the first latch circuit, the second counter circuit, the addition circuit, and the second latch circuit.

8. The image sensor of claim 6, wherein the first counter circuit includes:

a first latch circuit configured to latch the counting code corresponding to the at least one least significant bit signal, convert the latched counting code into a binary code, and output the binary code;

a second latch circuit configured to latch a first binary code among outputs of the first latch circuit; and the addition circuit configured to add a second binary code among the outputs of the first latch circuit and the first binary code latched by the second latch circuit, and wherein the first latch circuit, the addition circuit, the second counter circuit, and the second latch circuit are arranged close to the comparator along the first virtual line in an order of the first latch circuit, the addition circuit, the second counter circuit, and the second latch circuit along the first virtual line.

9. The image sensor of claim 1, wherein the count value includes the at least one least significant bit signal and the most significant bit signals, and wherein a number of bits of the at least one least significant bit signal is less than a number of bits of the most significant bit signals.

10. The image sensor of claim 1, wherein the second counter circuit is configured to generate the most significant bit signals sequentially toggling in response to a bit signal corresponding to the most significant bit of the least significant bit signal.

11. The image sensor of claim 1, wherein the counting code includes a gray code, and the second counter circuit includes a ripple counter based on a binary code.

12. An image sensor comprising:

a pixel array including a plurality of pixels;

a plurality of column lines configured to output pixel voltages of the plurality of pixels;

a plurality of comparators connected to each of the plurality of column lines, and each configured to generate a comparison signal based on a ramp signal and a pixel voltage; and a plurality of counter circuits configured to receive the comparison signal from each of the plurality of comparators and output a count value corresponding to the pixel voltage based on the comparison signal, wherein each of the plurality of counter circuits includes:

a first latch circuit configured to latch a gray code;

a second latch circuit configured to latch a first binary code among outputs of the first latch circuit;

a most significant bit counter circuit configured to receive an output of a most significant bit among the outputs of the first latch circuit and count high-order n bits of the count value, wherein the n is an integer of 1 or more; and an arithmetic unit configured to perform an operation on a second binary code among the outputs of the first latch circuit and the first binary code, wherein the gray code corresponds to lower-order m bits of the count value, wherein the m is an integer of 1 or more, and wherein the most significant bit counter circuit is arranged such that a first distance between the first latch circuit and the most significant bit counter circuit is smaller than a second distance between the first latch circuit and the second latch circuit.

13. The image sensor of claim 12, wherein the most significant bit counter circuit includes a plurality of flip-flops configured to sequentially toggle in response to a most significant bit signal among outputs of the first latch circuit or an inversion signal of the most significant bit signal to count "n" upper bits of the count value.

14. The image sensor of claim 12, wherein the first latch circuit includes:

a plurality of latches each configured to latch a bit of the gray code; and a binary conversion unit configured to convert an output of the plurality of latches into a binary code.

15. The image sensor of claim 12, wherein the first latch circuit, the most significant bit counter circuit, the arithmetic unit, and the second latch circuit are arranged adjacent to a corresponding comparator among the plurality of comparators in an order of the first latch circuit, the most significant bit counter circuit, the arithmetic unit, and the second latch circuit.

16. The image sensor of claim 12, wherein the first latch circuit, the arithmetic unit, the most significant bit counter circuit, and the second latch circuit are arranged adjacent to a corresponding comparator among the plurality of comparators in an order of the first latch circuit, the arithmetic unit, the most significant bit counter circuit, and the second latch circuit.

17. An image sensor comprising:

a pixel array including a plurality of pixels, each pixel configured to output a pixel signal; and an analog-to-digital converter configured to convert the pixel signal into pixel data, wherein the analog-to-digital converter comprises:

a comparator configured to generate a comparison signal based on a ramp signal and an input signal; and a counter circuit configured to receive a counting code and the comparison signal and output a count value corresponding to a magnitude of the input signal based on the comparison signal, wherein the counter circuit includes:

a first counter circuit including a plurality of latch circuits and an adder, and the first counter circuit configured to:

latch the counting code, and generate least significant bit signals of the count value; and a second counter circuit configured to generate most significant bit signals sequentially toggling in response to one of the least significant bit signals or an inversion signal of the one of the least significant bit signals, and wherein the plurality of latch circuits, the adder, and the second counter circuit are arranged in series, and the second counter circuit is arranged between the plurality of latch circuits.

18. The image sensor of claim 17, wherein:

the first counter circuit includes a first latch circuit and a second latch circuit, the adder is configured to generate the least significant bit signal by adding a first bit signal stored in the first latch circuit and a second bit signal stored in the second latch circuit, and the second counter circuit includes a plurality of flip-flops connected to each other in cascade, wherein the flip-flop located at the front most among the plurality of flip-flops is configured to receive the most significant bit signal or an inverted signal of the most significant bit signal as a clock signal.

19. The image sensor of claim 18, further comprising:

a first line configured to connect the adder and the first latch circuit;

a second line configured to connect the adder and the second latch circuit; and a third line configured to connect the first latch circuit and the second counter circuit, wherein a length of the third line is shorter than a length of at least one of the first line and the second line.

20. The image sensor of claim 19, wherein the first line transmits the first bit signal, the second line transmits the second bit signal, and the third line transmits the most significant bit signal.

* * * * *